United States Patent
Feng et al.

(10) Patent No.: US 12,217,696 B2
(45) Date of Patent: Feb. 4, 2025

(54) SCAN DRIVING CIRCUIT WITH SHIFT REGISTERS, DISPLAY PANEL AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/914,047

(22) PCT Filed: Nov. 9, 2021

(86) PCT No.: PCT/CN2021/129557
§ 371 (c)(1),
(2) Date: Sep. 23, 2022

(87) PCT Pub. No.: WO2022/247154
PCT Pub. Date: Dec. 1, 2022

(65) Prior Publication Data
US 2024/0212623 A1 Jun. 27, 2024

(30) Foreign Application Priority Data

May 28, 2021 (CN) .......................... 202110592519.3

(51) Int. Cl.
*G09G 3/3266* (2016.01)
*G09G 3/32* (2016.01)
*G11C 19/28* (2006.01)

(52) U.S. Cl.
CPC ............. *G09G 3/3266* (2013.01); *G09G 3/32* (2013.01); *G09G 2310/0267* (2013.01);
(Continued)

(58) Field of Classification Search
CPC ..................................................... G09G 3/3266
See application file for complete search history.

(56) References Cited

U.S. PATENT DOCUMENTS 4,180,798 A * 12/1979 Komori ................. G06V 10/98
382/181
7,825,878 B2 * 11/2010 Kawabe ............... G09G 3/2029
345/100

(Continued)

FOREIGN PATENT DOCUMENTS

CN 105719593 A 6/2016
CN 108831387 A 11/2018
(Continued)

OTHER PUBLICATIONS

First Office Action for Chinese Patent Application No. 202110592519.3 issued by the Chinese Patent Office on Dec. 31, 2021.

*Primary Examiner* — Chun-Nan Lin
(74) *Attorney, Agent, or Firm* — IP & T GROUP LLP

(57) ABSTRACT

A scan driving circuit includes shift registers and clock signal lines. A shift register includes: an output circuit electrically connected to a scan input signal terminal and a pull-up node; a black frame insertion circuit electrically connected to a first clock signal terminal, a black frame insertion input signal terminal, a first voltage signal terminal, a second clock signal terminal and the pull-up node; and an output circuit electrically connected to the pull-up node, a third clock signal terminal, a shift signal terminal, a fourth clock signal terminal and a first output signal terminal. The shift registers include first shift registers and second shift registers. Third and fourth clock signal terminals of a first (Continued)

shift register are electrically connected to a same clock signal line. Third and fourth clock signal terminals of a second shift register are electrically connected to different clock signal lines.

18 Claims, 17 Drawing Sheets

(52) U.S. Cl.
CPC . *G09G 2310/0286* (2013.01); *G09G 2310/08* (2013.01); *G11C 19/28* (2013.01)

(56) References Cited

U.S. PATENT DOCUMENTS

| | | | | |
|---|---|---|---|---|
| 11,443,706 | B2* | 9/2022 | Xu | G09G 3/3611 |
| 11,455,956 | B2* | 9/2022 | Feng | G11C 19/28 |
| 11,545,093 | B2* | 1/2023 | Feng | G09G 3/3266 |
| 2016/0042684 | A1* | 2/2016 | Kim | G09G 3/3674 |
| | | | | 345/55 |
| 2016/0125793 | A1* | 5/2016 | Kim | G09G 3/3648 |
| | | | | 345/213 |
| 2018/0188578 | A1* | 7/2018 | Wang | G02F 1/1343 |
| 2019/0139495 | A1* | 5/2019 | Qin | G09G 3/3266 |
| 2019/0206503 | A1* | 7/2019 | Zhang | G09G 3/20 |
| 2019/0213970 | A1* | 7/2019 | Wang | G09G 3/3677 |
| 2019/0251891 | A1* | 8/2019 | Tang | G09G 3/3677 |
| 2020/0020410 | A1* | 1/2020 | Du | G11C 19/28 |
| 2021/0005127 | A1* | 1/2021 | Yuan | G09G 3/20 |
| 2021/0005145 | A1 | 1/2021 | Lee et al. | |
| 2021/0335177 | A1* | 10/2021 | Feng | G11C 19/28 |
| 2021/0335199 | A1* | 10/2021 | Yuan | G09G 3/2092 |
| 2021/0343208 | A1* | 11/2021 | Wang | G11C 19/28 |
| 2022/0005400 | A1 | 1/2022 | Feng et al. | |
| 2022/0114945 | A1* | 4/2022 | Wang | G09G 3/3266 |
| 2022/0343858 | A1* | 10/2022 | Feng | G09G 3/3233 |

FOREIGN PATENT DOCUMENTS

| | | | | |
|---|---|---|---|---|
| CN | 110136653 | A | 8/2019 | |
| CN | 111599315 | A | 8/2020 | |
| CN | 112259032 | A | 1/2021 | |
| CN | 113257186 | A | 8/2021 | |
| CN | 111599315 | * | 11/2021 | G09G 3/3266 |

* cited by examiner

SCAN DRIVING CIRCUIT WITH SHIFT REGISTERS, DISPLAY PANEL AND DISPLAY APPARATUS

CROSS-REFERENCE TO RELATED APPLICATIONS

The application is a national phase entry under 35 USC 371 of International Patent Application No. PCT/CN2021/129557, filed on Nov. 9, 2021, which claims priority to Chinese Patent Application No. 202110592519.3, filed on May 28, 2021, which are incorporated herein by reference in their entirety.

TECHNICAL FIELD

The present disclosure relates to the field of display technologies, and in particular, to a scan driving circuit, a display panel and a display apparatus.

BACKGROUND

A scan driving circuit is an important component in a display apparatus. The scan driving circuit may include a plurality of shift registers that are cascaded, and each shift register may be electrically connected to a line in the display apparatus. The scan driving circuit may input scan signals to a plurality of lines (e.g., gate lines or enable signal lines) in the display apparatus one by one, so that the display apparatus can display images.

By providing the scan driving circuit in the display apparatus, it may be possible to effectively reduce costs and improve the yield.

SUMMARY

In an aspect, a scan driving circuit is provided. The scan driving circuit includes a plurality of shift registers and a plurality of clock signal lines. A shift register of the plurality of shift registers includes: an input circuit, a black frame insertion circuit, an output circuit, a scan input signal terminal, a first clock signal terminal, a black frame insertion input signal terminal, a first voltage signal terminal, a second clock signal terminal, a third clock signal terminal, a shift signal terminal, a fourth clock signal terminal and a first output signal terminal. The input circuit is electrically connected to the scan input signal terminal and a pull-up node. The input circuit is configured to, in response to a scan input signal received at the scan input signal terminal, transmit the scan input signal to the pull-up node. The black frame insertion circuit is electrically connected to the first clock signal terminal, the black frame insertion input signal terminal, the first voltage signal terminal, the second clock signal terminal and the pull-up node. The black frame insertion circuit is configured to, under control of a first clock signal transmitted by the first clock signal terminal, a black frame insertion input signal transmitted by the black frame insertion input signal terminal and a second clock signal transmitted by the second clock signal terminal, transmit the second clock signal to the pull-up node. The output circuit is electrically connected to the pull-up node, the third clock signal terminal, the shift signal terminal, the fourth clock signal terminal and the first output signal terminal. The output circuit is configured to transmit a third clock signal received at the third clock signal terminal to the shift signal terminal under control of a voltage of the pull-up node, and transmit a fourth clock signal received at the fourth clock signal terminal to the first output signal terminal under the control of the voltage of the pull-up node. The plurality of shift registers include first shift registers and second shift registers. A third clock signal terminal and a fourth clock signal terminal of a first shift register of the first shift registers are electrically connected to a same clock signal line. A third clock signal terminal and a fourth clock signal terminal of a second shift register of the second shift registers are electrically connected to different clock signal lines, respectively.

In some embodiments, at least one first shift register of the first shift registers is arranged between any two adjacent second shift registers of the second shift registers.

In some embodiments, the plurality of shift registers include a plurality of shift register groups; a shift register group of the plurality of shift register groups includes at least one of the first shift registers and at least one of the second shift registers. A shift signal terminal of a second shift register in an M-th shift register group is electrically connected to a black frame insertion input signal terminal of at least one shift register in an (M+1)-th shift register group, M being a positive integer.

In some embodiments, the shift register group includes two or more first shift registers and one second shift register. The shift signal terminal of the second shift register in the M-th shift register group is electrically connected to black frame insertion input signal terminals of all shift registers in the (M+1)-th shift register group.

In some embodiments, a third clock signal terminal of the second shift register in the M-th shift register group and a third clock signal terminal of a second shift register in the (M+1)-th shift register group are electrically connected to different clock signal lines.

In some embodiments, the third clock signal terminal of the second shift register in the M-th shift register group and a third clock signal terminal of a second shift register in an (M+2)-th shift register group are electrically connected to a same clock signal line.

In some embodiments, the shift register group includes two or more second shift registers; and third clock signal terminals of two or more second shift registers in a same shift register group are electrically connected to different clock signal lines, respectively.

In some embodiments, a number of clock signal lines electrically connected to fourth clock signal terminals of the plurality of shift registers is a sum of a number of shift registers included in the M-th shift register group and a number of shift registers included in the (M+1)-th shift register group; and a number of clock signal lines electrically connected to third clock signal terminals of the second shift registers is a sum of a number of second shift registers included in the M-th shift register group and a number of second shift registers included in the (M+1)-th shift register group.

In some embodiments, the shift register group includes seven first shift registers and one second shift register. The plurality of clock signal lines include: a first clock signal sub-line electrically connected to a third clock signal terminal and a fourth clock signal terminal of a first first shift register in the M-th shift register group; a second clock signal sub-line electrically connected to a third clock signal terminal and a fourth clock signal terminal of a second first shift register in the M-th shift register group; a third clock signal sub-line electrically connected to a third clock signal terminal and a fourth clock signal terminal of a third first shift register in the M-th shift register group; a fourth clock signal sub-line electrically connected to a third clock signal terminal and a fourth clock signal terminal of a fourth first shift register in the M-th shift register group; a fifth clock signal sub-line electrically connected to a third clock signal terminal and a fourth clock signal terminal of a fifth first shift register in the M-th shift register group; a sixth clock signal sub-line electrically connected to a third clock signal terminal and a fourth clock signal terminal of a sixth first shift register in the M-th shift register group; a seventh clock signal sub-line electrically connected to a third clock signal terminal and a fourth clock signal terminal of a seventh first shift register in the M-th shift register group; an eighth clock signal sub-line electrically connected to a third clock signal terminal of the second shift register in the M-th shift register group; a ninth clock signal sub-line electrically connected to a fourth clock signal terminal of the second shift register in the M-th shift register group; a tenth clock signal sub-line electrically connected to a third clock signal terminal and a fourth clock signal terminal of a first first shift register in the (M+1)-th shift register group; an eleventh clock signal sub-line electrically connected to a third clock signal terminal and a fourth clock signal terminal of a second first shift register in the (M+1)-th shift register group; a twelfth clock signal sub-line electrically connected to a third clock signal terminal and a fourth clock signal terminal of a third first shift register in the (M+1)-th shift register group; a thirteenth clock signal sub-line electrically connected to a third clock signal terminal and a fourth clock signal terminal of a fourth first shift register in the (M+1)-th shift register group; a fourteenth clock signal sub-line electrically connected to a third clock signal terminal and a fourth clock signal terminal of a fifth first shift register in the (M+1)-th shift register group; a fifteenth clock signal sub-line electrically connected to a third clock signal terminal and a fourth clock signal terminal of a sixth first shift register in the (M+1)-th shift register group; a sixteenth clock signal sub-line electrically connected to a third clock signal terminal and a fourth clock signal terminal of a seventh first shift register in the (M+1)-th shift register group; a seventeenth clock signal sub-line electrically connected to a third clock signal terminal of a second shift register in the (M+1)-th shift register group; and an eighteenth clock signal sub-line electrically connected to a fourth clock signal terminal of the second shift register in the (M+1)-th shift register group.

In some embodiments, at least two shift registers of shift registers included in the shift register group share one black frame insertion circuit.

In some embodiments, the shift register further includes a fifth clock signal terminal and a second output signal terminal. The output circuit is further electrically connected to the fifth clock signal terminal and the second output signal terminal. The output circuit is further configured to transmit a fifth clock signal received at the fifth clock signal terminal to the second output signal terminal under the control of the voltage of the pull-up node.

In some embodiments, the black frame insertion circuit includes a black frame insertion control sub-circuit, a black frame insertion input sub-circuit and a black frame insertion transmission sub-circuit. The black frame insertion control sub-circuit is electrically connected to the first clock signal terminal, the black frame insertion input signal terminal, the first voltage signal terminal and a first black frame insertion node. The black frame insertion control sub-circuit is configured to transmit the black frame insertion input signal transmitted by the black frame insertion input signal terminal to the first black frame insertion node under control of the first clock signal. The black frame insertion input sub-circuit is electrically connected to the first black frame insertion node, the second clock signal terminal and a second black frame insertion node. The black frame insertion input sub-circuit is configured to transmit the second clock signal transmitted by the second clock signal terminal to the second black frame insertion node under control of a voltage of the first black frame insertion node. The black frame insertion transmission sub-circuit is electrically connected to the second clock signal terminal, the second black frame insertion node and the pull-up node. The black frame insertion transmission sub-circuit is configured to transmit the second clock signal from the second black frame insertion node to the pull-up node under control of the second clock signal.

In some embodiments, the input circuit includes a first transistor. A control electrode of the first transistor is electrically connected to the scan input signal terminal, a first electrode of the first transistor is electrically connected to the scan input signal terminal, and a second electrode of the first transistor is electrically connected to the pull-up node. The black frame insertion circuit includes a black frame insertion control sub-circuit, a black frame insertion input sub-circuit and a black frame insertion transmission sub-circuit. The black frame insertion control sub-circuit includes a second transistor and a first capacitor. A control electrode of the second transistor is electrically connected to the first clock signal terminal, a first electrode of the second transistor is electrically connected to the black frame insertion input signal terminal, and a second electrode of the second transistor is electrically connected to the first black frame insertion node. A first terminal of the first capacitor is electrically connected to the first black frame insertion node, and a second terminal of the first capacitor is electrically connected to the first voltage signal terminal. The black frame insertion input sub-circuit includes a third transistor. A control electrode of the third transistor is electrically connected to the first black frame insertion node, a first electrode of the third transistor is electrically connected to the second clock signal terminal, and a second electrode of the third transistor is electrically connected to the second black frame insertion node. The black frame insertion transmission sub-circuit includes a fourth transistor. A control electrode of the fourth transistor is electrically connected to the second clock signal terminal, a first electrode of the fourth transistor is electrically connected to the second black frame insertion node, and a second electrode of the fourth transistor is electrically connected to the pull-up node. The output circuit includes a fifth transistor, a sixth transistor and a second capacitor. A control electrode of the fifth transistor is electrically connected to the pull-up node, a first electrode of the fifth transistor is electrically connected to the third clock signal terminal, and a second electrode of the fifth transistor is electrically connected to the shift signal terminal. A control electrode of the sixth transistor is electrically connected to the pull-up node, a first electrode of the sixth transistor is electrically connected to the fourth clock signal terminal, and a second electrode of the sixth transistor is electrically connected to the first output signal terminal. A first terminal of the second capacitor is electrically connected to the pull-up node, and a second terminal of the second capacitor is electrically connected to the first output signal terminal.

In some embodiments, the output circuit is further electrically connected to a fifth clock signal terminal and a second output signal terminal. The output circuit further includes a seventh transistor and a third capacitor. A control electrode of the seventh transistor is electrically connected to the pull-up node, a first electrode of the seventh transistor is electrically connected to the fifth clock signal terminal, and a second electrode of the seventh transistor is electrically connected to the second output signal terminal. A first terminal of the third capacitor is electrically connected to the pull-up node, and a second terminal of the third capacitor is electrically connected to the second output signal terminal.

In some embodiments, the shift register further includes: a control circuit, a first reset circuit, a second reset circuit, a third reset circuit, a fourth reset circuit, a second voltage signal terminal, a third voltage signal terminal, a first reset signal terminal and a second reset signal terminal. The control circuit is electrically connected to the second voltage signal terminal, the pull-up node, the first voltage signal terminal and a pull-down node. The control circuit is configured to: in response to a second voltage signal received at the second voltage signal terminal, transmit the second voltage signal to the pull-down node; and under the control of the voltage of the pull-up node, transmit a first voltage signal received at the first voltage signal terminal to the pull-down node. The first reset circuit is electrically connected to the first reset signal terminal, the pull-up node and the first voltage signal terminal. The first reset circuit is configured to transmit the first voltage signal to the pull-up node under control of a first reset signal transmitted by the first reset signal terminal. The second reset circuit is electrically connected to the first black frame insertion node, the second reset signal terminal, the pull-up node and the first voltage signal terminal. The second reset circuit is configured to transmit the first voltage signal to the pull-up node under control of the voltage of the first black frame insertion node and a second reset signal transmitted by the second reset signal terminal. The third reset circuit is electrically connected to the pull-down node, the pull-up node and the first voltage signal terminal. The third reset circuit is configured to transmit the first voltage signal to the pull-up node under control of a voltage of the pull-down node. The fourth reset circuit is electrically connected to the pull-down node, the shift signal terminal, the first output signal terminal, the first voltage signal terminal and the third voltage signal terminal. The fourth reset circuit is configured to, under the control of the voltage of the pull-down node, transmit the first voltage signal to the shift signal terminal and transmit a third voltage signal transmitted by the third voltage signal terminal to the first output signal terminal. The output circuit is further electrically connected to a fifth clock signal terminal and a second output signal terminal. The fourth reset circuit is further electrically connected to the second output signal terminal. The fourth reset circuit is further configured to transmit the third voltage signal to the second output signal terminal under the control of the voltage of the pull-down node.

In some embodiments, the control circuit includes an eighth transistor, a ninth transistor, a tenth transistor and an eleventh transistor. A control electrode of the eighth transistor is electrically connected to the second voltage signal terminal, a first electrode of the eighth transistor is electrically connected to the second voltage signal terminal, and a second electrode of the eighth transistor is electrically connected to a control electrode of the ninth transistor and a first electrode of the tenth transistor. A first electrode of the ninth transistor is electrically connected to the second voltage signal terminal, and a second electrode of the ninth transistor is electrically connected to the pull-down node. A control electrode of the tenth transistor is electrically connected to the pull-up node, and a second electrode of the tenth transistor is electrically connected to the first voltage signal terminal. A control electrode of the eleventh transistor is electrically connected to the pull-up node, a first electrode of the eleventh transistor is electrically connected to the pull-down node, and a second electrode of the eleventh transistor is electrically connected to the first voltage signal terminal. The first reset circuit includes a twelfth transistor. A control electrode of the twelfth transistor is electrically connected to the first reset signal terminal, a first electrode of the twelfth transistor is electrically connected to the pull-up node, and a second electrode of the twelfth transistor is electrically connected to the first voltage signal terminal. The second reset circuit includes a thirteenth transistor and a fourteenth transistor. A control electrode of the thirteenth transistor is electrically connected to the first black frame insertion node, a first electrode of the thirteenth transistor is electrically connected to the pull-up node, and a second electrode of the thirteenth transistor is electrically connected to a first electrode of the fourteenth transistor. A control electrode of the fourteenth transistor is electrically connected to the second reset signal terminal, and a second electrode of the fourteenth transistor is electrically connected to the first voltage signal terminal. The third reset circuit includes a fifteenth transistor. A control electrode of the fifteenth transistor is electrically connected to the pull-down node, a first electrode of the fifteenth transistor is electrically connected to the pull-up node, and a second electrode of the fifteenth transistor is electrically connected to the first voltage signal terminal. The fourth reset circuit includes a sixteenth transistor, a seventeenth transistor and an eighteenth transistor. A control electrode of the sixteenth transistor is electrically connected to the pull-down node, a first electrode of the sixteenth transistor is electrically connected to the shift signal terminal, and a second electrode of the sixteenth transistor is electrically connected to the first voltage signal terminal. A control electrode of the seventeenth transistor is electrically connected to the pull-down node, a first electrode of the seventeenth transistor is electrically connected to the first output signal terminal, and a second electrode of the seventeenth transistor is electrically connected to the third voltage signal terminal. A control electrode of the eighteenth transistor is electrically connected to the pull-down node, a first electrode of the eighteenth transistor is electrically connected to the second output signal terminal, and a second electrode of the eighteenth transistor is electrically connected to the third voltage signal terminal.

In another aspect, a display panel is provided. The display panel includes the scan driving circuit as described in any one of the above embodiments.

In yet another aspect, a display apparatus is provided. The display apparatus includes the display panel as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
FIG. 1 is a structural diagram of a display apparatus, in accordance with some embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "multiple", "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when", "in a case where", "in response to determining", or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of the phrase "applicable to" or "configured to" herein means an open and inclusive meaning, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term "about" or "approximately" includes a stated value and an average value within an acceptable deviation range of a specific value. The acceptable deviation range is determined by a person of ordinary skill in the art in view of the measurement in question and the error associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature being curved. Therefore, the regions shown in the accompanying drawings are schematic in nature, and their shapes are not intended to show actual shapes of the regions in a device, and are not intended to limit the scope of the exemplary embodiments.

Transistors used in circuits provided in embodiments of the present disclosure may be thin film transistors, field effect transistors (e.g., metal oxide semiconductor), or other switching devices with same characteristics. The embodiments of the present disclosure will all be described by taking an example where the transistors are all thin film transistors.

In some embodiments, a control electrode of each transistor used in a shift register is a gate of the transistor, a first electrode of the transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided in the embodiments of the present disclosure, "nodes" such as a pull-up node and a pull-down node do not represent real components, but represent junctions of related electrical connections in a circuit diagram. That is to say, these nodes are nodes equivalent to the junctions of relevant electrical connections in the circuit diagram.

In the embodiments of the present disclosure, the term "pull up" refers to charging a node or an electrode of a transistor, so that an absolute value of a voltage of the node or the electrode is increased, and operating (e.g., turning on) of a corresponding transistor is realized. The term "pull down" refers to discharging a node or an electrode of a transistor, so that an absolute value of a voltage of the node or the electrode is reduced, and operating (e.g., turning off) of a corresponding transistor is realized.

Hereinafter, the circuits provided in the embodiments of the present disclosure will be described by taking an example where the transistors are all N-type transistors.

Some embodiments of the present disclosure provide a scan driving circuit, a display panel and a display apparatus. The scan driving circuit, the display panel and the display apparatus will be introduced respectively below.

Some embodiments of the present disclosure provide the display apparatus 2000 as shown in FIG. 1. The display apparatus 2000 may be any apparatus that displays images whether in motion (e.g., a video) or stationary (e.g., a static image), and whether textual or graphical. More specifically, the embodiments may be implemented in or associated with a variety of electronic apparatuses. The variety of electronic apparatuses are, for example (but are not limited to), mobile phones, wireless apparatuses, personal data assistants (PDAs), hand-held or portable computers, global positioning system (GPS) receivers/navigators, cameras, MPEG-4 Part 14 (MP4) video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., displays for displaying an image of a piece of jewelry).

In some examples, as shown in FIG. 1, the display apparatus 2000 includes the display panel 1000.

For example, the display apparatus 2000 may further include a frame, a circuit board, a source driver chip, and other electronic components. The display panel 1000 may be, for example, disposed in the frame.

The type of the display panel 1000 varies, which may be set according to actual needs.

For example, the display panel 1000 may be an organic light-emitting diode (OLED) display panel, a quantum dot light-emitting diode (QLED) display panel, or a micro light-emitting diode (Micro LED) display panel, which is not specifically limited in the present disclosure.

Some embodiments of the present disclosure will be schematically described below by taking an example in which the display panel 100 is an OLED display panel.

Figure 2:
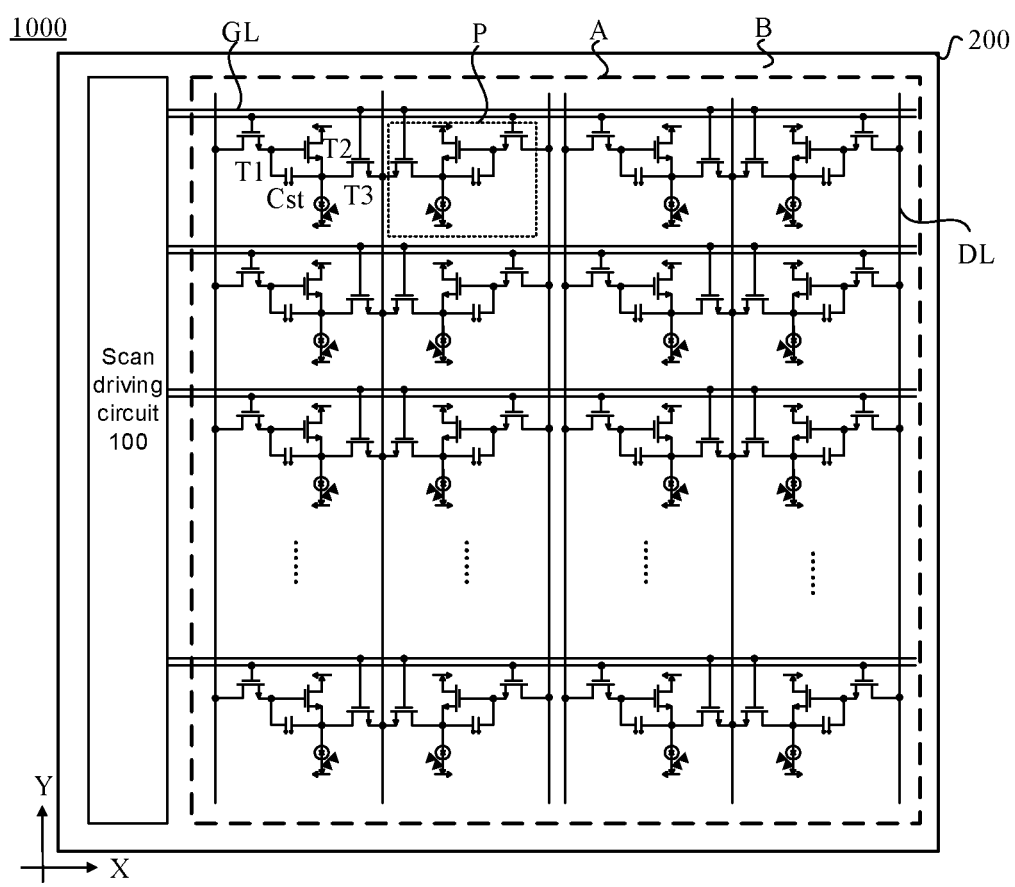
FIG. 2 is a structural diagram of a display panel, in accordance with some embodiments of the present disclosure.
Figure 3:
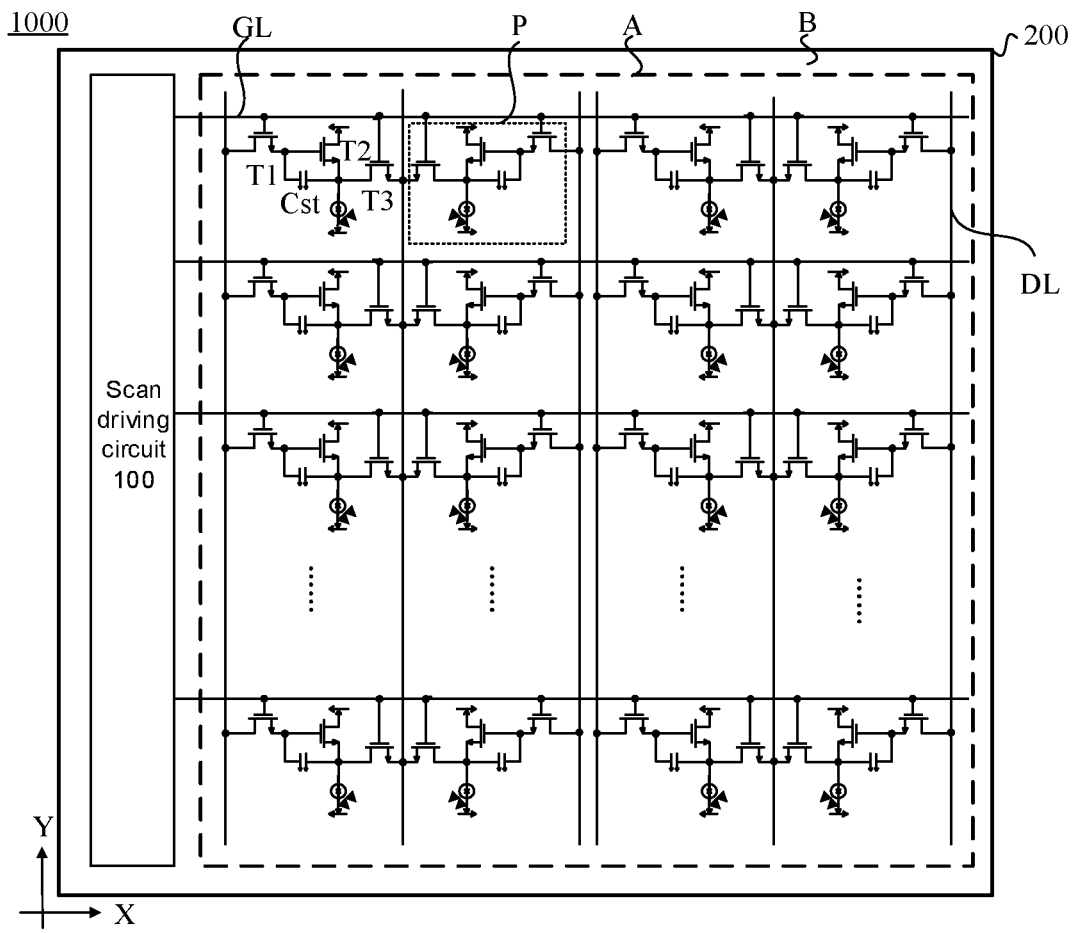
FIG. 3 is a structural diagram of another display panel, in accordance with some embodiments of the present disclosure.

In some embodiments, as shown in FIGS. 2 and 3, the display panel 1000 has a display area A and a border area B disposed beside the display area A. Here, the word "beside" refers to one side, two sides, three sides or all sides of the display area A. That is, the border area B may be located on one side, two sides or three sides of the display area A, or the border area B may be disposed around the display area A.

In some examples, as shown in FIGS. 2 and 3, the display panel 1000 may include the scan driving circuit 100 and a substrate 200. The substrate 200 is used for supporting the scan driving circuit 100.

Here, the scan driving circuit 100 may be located in the frame area B or the display area A, and the present disclosure is not limited thereto.

The type of the substrate 200 varies, which may be set according to actual needs.

For example, the substrate 200 may be a rigid substrate. The rigid substrate may be, for example, a glass substrate or a polymethyl methacrylate (PMMA) substrate.

For example, the substrate 200 may be a flexible substrate. The flexible substrate may be, for example, a polyethylene terephthalate (PET) substrate, a polyethylene naphthalate (PEN) substrate or a polyimide (PI) substrate. In this case, the display panel 1000 may be a flexible display panel.

The scan driving circuit 100 may be, for example, a light-emitting control circuit or a gate driving circuit. The embodiments of the present disclosure will be schematically described by taking an example in which the scan driving circuit 100 is a gate driving circuit.

In some examples, as shown in FIGS. 2 and 3, the display panel 1000 may further include a plurality of sub-pixels P disposed on a side of the substrate 200 and located in the display area A. For example, the plurality of sub-pixels P may be arranged in a plurality of rows extending in a first direction X, and arranged in a plurality of columns extending in a second direction Y. Each row of sub-pixels P may include multiple sub-pixels P, and each column of sub-pixels P may include multiple sub-pixels P.

The first direction X and the second direction Y intersect with each other. An included angle between the first direction X and the second direction Y may be set according to actual needs. For example, the included angle between the first direction X and the second direction Y may be 85 degrees (85°), 89° or 90°.

In some examples, as shown in FIGS. 2 and 3, the display panel 1000 may further include a plurality of gate lines GL and a plurality of data lines DL that are disposed on the side of the substrate 200 and located in the display area A. The plurality of gate lines GL extend in the first direction X, and the plurality of data lines DL extend in the second direction Y.

For example, sub-pixels P arranged in a line in the first direction X may be referred to as sub-pixels P in a same row, and sub-pixels P arranged in a line in the second direction Y may be referred to as sub-pixels P in a same column. Sub-pixels P in a same row may be electrically connected to a single gate line GL, and sub-pixels P in a same column may be electrically connected to a single data line DL.

Figure 4:
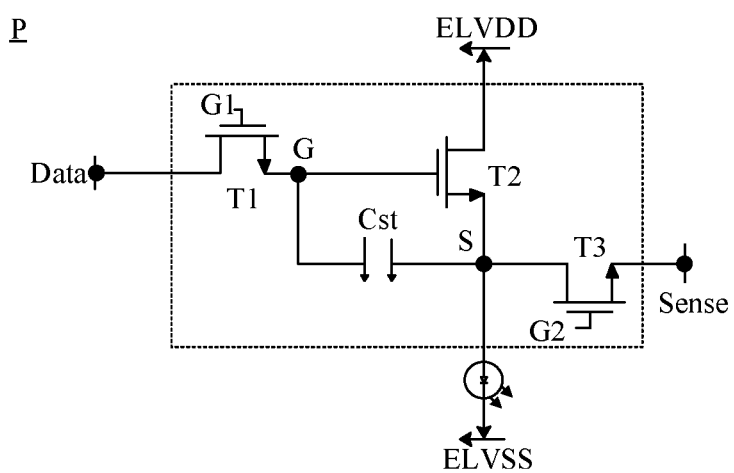
FIG. 4 is a circuit diagram of a sub-pixel, in accordance with some embodiments of the present disclosure.

For example, as shown in FIG. 4, each sub-pixel P of the plurality of sub-pixels P may include a pixel driving circuit and a light-emitting device electrically connected to the pixel driving circuit. The light-emitting device may be an OLED.

For example, a gate line GL may be electrically connected to pixel driving circuits in a same row of sub-pixels P, and a data line DL may be electrically connected to pixel driving circuits in a same column of sub-pixels P.

The structure of the pixel driving circuit may vary, which may be set according to actual needs. For example, the structure of the pixel driving circuit may include a structure of "2T1C", "3T1C", "6T1C", "7T1C", "6T2C" or "7T2C". Here, "T" represents a transistor, a number before "T" represents the number of transistors, "C" represents a storage capacitor, and a number before "C" represents the number of storage capacitors.

During the use of the display panel 1000, the stability of the transistors in the pixel driving circuit and the light-emitting device may be decreased (for example, a threshold voltage of the driving transistor may be shifted), which affects a display effect of the display panel 1000. Therefore, the sub-pixel P is required to be compensated.

The method of compensating the sub-pixel P may vary, which may be set according to actual needs. For example, the sub-pixel P may be provided with a pixel compensation circuit therein, so that the sub-pixel P is compensated through the pixel compensation circuit. For another example, a transistor in the sub-pixel P may sense the driving transistor or the light-emitting device and transmit the sensed data to an external sensing circuit, and the external sensing circuit calculates a driving voltage value required for compensation and performs feedback, thereby realizing an external compensation for the sub-pixel P.

The structure and the operating process of the sub-pixel P will be schematically described in the embodiments of the present disclosure by taking an example in which the external compensation method (for sensing the driving transistor) is adopted and the pixel driving circuit has a "3T1C" structure.

For example, as shown in FIG. 4, the pixel driving circuit may include a switching transistor T1, a driving transistor T2, a sensing transistor T3 and a storage capacitor Cst.

For example, as shown in FIG. 4, a control electrode of the switching transistor T1 is electrically connected to a first scan signal terminal G1, a first electrode of the switching transistor T1 is electrically connected to a data signal terminal Data, and a second electrode of the switching transistor T1 is electrically connected to a first node G. The switching transistor T1 is configured to transmit a data signal received at the data signal terminal Data to the first node G in response to a first scan signal received at the first scan signal terminal G1.

The data signal includes, for example, a detection data signal and a display data signal. The detection data signal is used in a blank period, and the display data signal is used in a display period. As for the display period and the blank period, reference may be made to the description in some embodiments below, and details will not be repeated here.

For example, as shown in FIG. 4, a control electrode of the driving transistor T2 is electrically connected to the first node G, a first electrode of the driving transistor T2 is electrically connected to a fourth voltage signal terminal ELVDD, and a second electrode of the driving transistor T2 is electrically connected to a second node S. The driving transistor T2 is configured to transmit a fourth voltage signal received at the fourth voltage signal terminal ELVDD to the second node S under control of a voltage of the first node G.

For example, as shown in FIG. 4, a first terminal of the storage capacitor Cst is electrically connected to the first node G, and a second terminal of the storage capacitor Cst is electrically connected to the second node S. The switching transistor T1 charges the first node G and the storage capacitor Cst synchronously.

For example, as shown in FIG. 4, an anode of the light-emitting device is electrically connected to the second node S, and a cathode of the light-emitting device is electrically connected to a fifth voltage signal terminal ELVSS. The light-emitting device is configured to emit light under a cooperation of the fourth voltage signal from the second node S and a fifth voltage signal transmitted by the fifth voltage signal terminal ELVSS.

For example, as shown in FIG. 4, a control electrode of the sensing transistor T3 is electrically connected to a second scan signal terminal G2, a first electrode of the sensing transistor T3 is electrically connected to the second node S, and a second electrode of the sensing transistor T3 is electrically connected to a sensing signal terminal Sense. The sensing transistor T3 is configured to detect electrical characteristic(s) of the driving transistor T2 in response to a second scan signal received at the second scan signal terminal G2, so as to realize the external compensation. The electrical characteristic(s) include, for example, a threshold voltage and/or a carrier mobility of the driving transistor T2.

Herein, the sensing signal terminal Sense may provide a reset signal or an acquisition sensing signal. The reset signal is used for resetting the second node S in the display period, and the acquisition sensing signal is used for acquiring the threshold voltage of the driving transistor T2 in the blank period.

Based on the structure of the pixel driving circuit, as shown in FIG. 2, pixel driving circuits in a same row of sub-pixels P may be electrically connected to two gate lines GL (i.e., a first gate line and a second gate line). For example, first scan signal terminals G1 of the pixel driving circuits in the same row of sub-pixels P may be electrically connected to the first gate line to receive a first scan signal transmitted by the first gate line; second scan signal terminals G2 of the pixel driving circuits in the same row of sub-pixels P may be electrically connected to the second gate line to receive a second scan signal transmitted by the second gate line.

It will be noted that, a display phase of one frame may include, for example, the display period and the blank period that are performed in sequence. In the embodiments of the present disclosure, only the display period will be schematically described.

Figure 5:
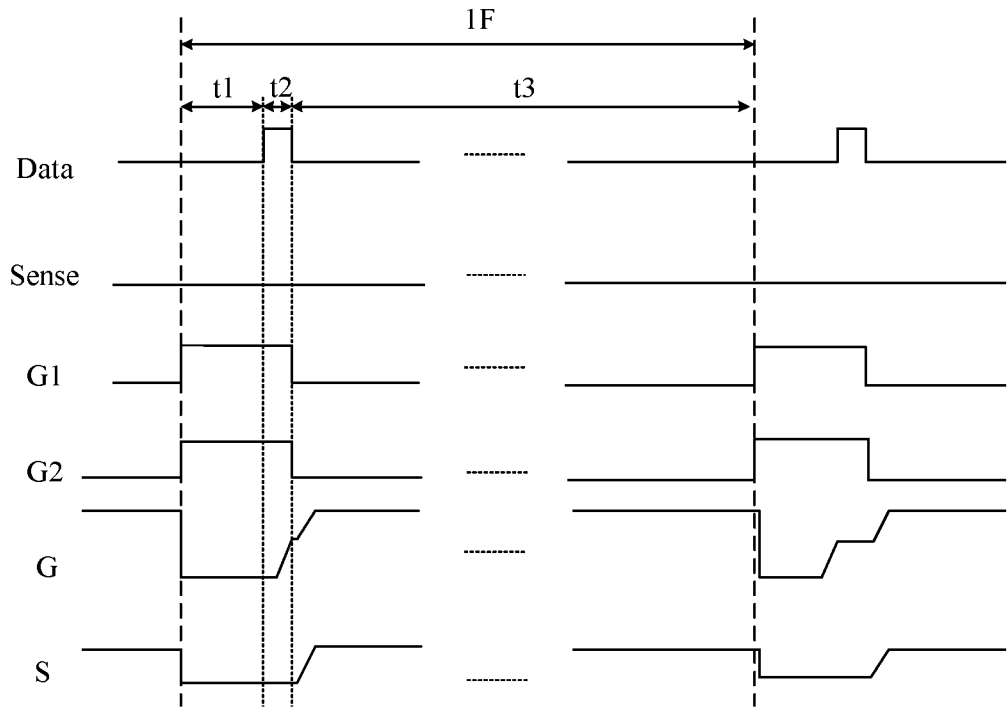
FIG. 5 is a timing diagram of the sub-pixel shown in FIG. 4, in accordance with the related art.

In the display period in the display phase of one frame, as shown in FIG. 5, an operating process of the sub-pixel P may include a reset phase t1, a data writing phase t2 and a light-emitting phase t3.

In the reset phase t1, the second scan signal provided by the second scan signal terminal G2 is at a high level, and the sensing signal terminal Sense provides a reset signal (for example, the reset signal is at a low level). The sensing transistor T3 is turned on under control of the second scan signal, receives the reset signal, and transmits the reset signal to the second node S, so as to reset the second node S.

In the data writing phase t2, the first scan signal provided by the first scan signal terminal G1 is at a high level, and the display data signal provided by the data signal terminal Data is at a high level. The switching transistor T1 is turned on under control of the first scan signal, receives the display data signal, and transmits the display data signal to the first node G and charges the storage capacitor Cst at the same time.

In the light-emitting phase t3, the first scan signal provided by the first scan signal terminal G1 is at a low level, the second scan signal provided by the second scan signal terminal G2 is at a low level, and the fourth voltage signal provided by the fourth voltage signal terminal ELVDD is at a high level. The switching transistor T1 is turned off under control of the first scan signal, and the sensing transistor T3 is turned off under control of the second scan signal. The storage capacitor Cst starts to discharge, so that the voltage of the first node G is maintained at a high level. The driving transistor T2 is turned on under control of the voltage of the first node G, receives the fourth voltage signal, and transmits the fourth voltage signal to the second node S. Therefore, the light-emitting device emits light under cooperation of the fourth voltage signal and the fifth voltage signal transmitted by the fifth voltage signal terminal ELVSS.

In some examples, the scan driving circuit 100 and the plurality of sub-pixels P are located on a same side of the substrate 200. The scan driving circuit 100 may include a plurality of shift registers 1. A single shift register 1 may be, for example, electrically connected to pixel driving circuits in at least one row of sub-pixels P.

It will be noted that, in the display phase of one frame, the first scan signal transmitted by the first scan signal terminal G1 and the second scan signal transmitted by the second scan signal terminal G2 are both provided by the scan driving circuit 100. That is, each shift register 1 in the scan driving circuit 100 may be electrically connected to a first scan signal terminal G1 through a first gate line, and transmits a first scan signal to the first scan signal terminal G1 through the first gate line; each shift register 1 in the scan driving circuit 100 may be electrically connected to a second scan signal terminal G2 through a second gate line, and transmits a second scan signal to the second scan signal terminal G2 through the second gate line.

Alternatively, as shown in FIG. 3, pixel driving circuits in a same row of sub-pixels P may be electrically connected to a same gate line GL. In this case, the first scan signal and the second scan signal are the same. Each shift register 1 in the scan driving circuit 100 may be electrically connected to a first scan signal terminal G1 and a second scan signal terminal G2 through a corresponding gate line GL, and transmits signals to the first scan signal terminal G1 and the second scan signal terminal G2 through the gate line GL.

In the related art, in the display process of the display panel 1000, image smearing phenomenon will occur during a process of switching dynamic images. That is, when the display panel 1000 switches a frame of image to another frame of image, a viewer will feel the image smearing of a previous frame of image (also referred to as motion picture smearing), which may affect the image display effect.

Figure 7:
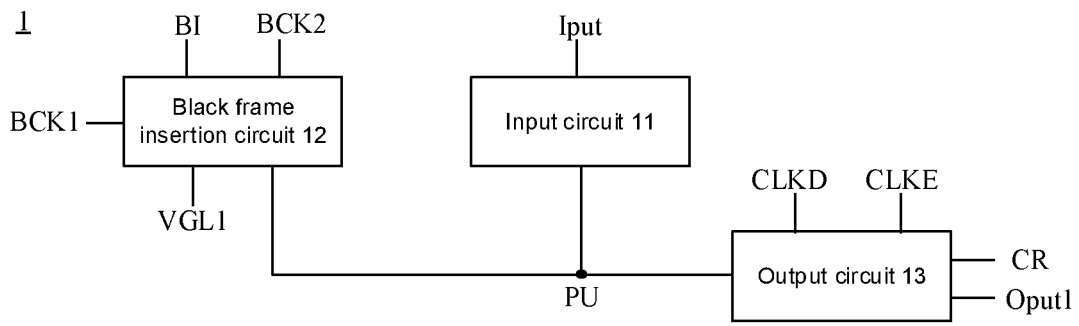
FIG. 7 is a structural diagram of a shift register, in accordance with some embodiments of the present disclosure.
Figure 8:
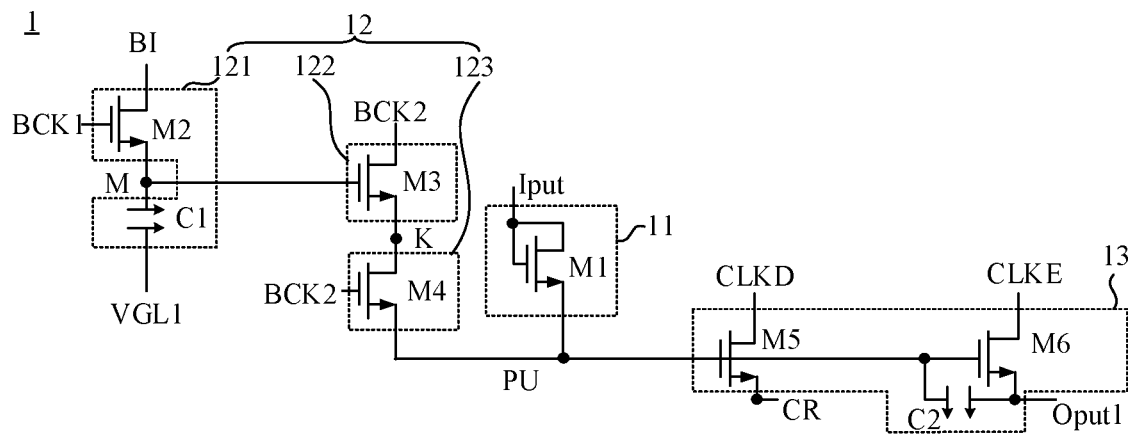
FIG. 8 is a circuit diagram of a shift register, in accordance with some embodiments of the present disclosure.

Based on this, as shown in FIGS. 7 and 8, in the scan driving circuit 100 provided in the embodiments of the present disclosure, the shift register 1 includes: an input circuit 11, a black frame insertion circuit 12, an output circuit 13, a scan input signal terminal Input (represented by "Iput" in the accompanying drawings and the following description), a first clock signal terminal BCK1, a black frame insertion input signal terminal BI, a first voltage signal terminal VGL1, a second clock signal terminal BCK2, a third clock signal terminal CLKD, a shift signal terminal CR, a fourth clock signal terminal CLKE and a first output signal terminal Onput1 (represented by "Oput1" in the accompanying drawings and the following description).

In some examples, as shown in FIGS. 7 and 8, the input circuit 11 is electrically connected to the scan input signal terminal Input and a pull-up node PU. The input circuit 11 is configured to, in response to a scan input signal received at the scan input signal terminal Input, transmit the scan input signal to the pull-up node PU.

For example, in a case where the scan input signal is at a high level, the input circuit 11 may be turned on due to the scan input signal, and transmits the scan input signal to the pull-up node PU to charge the pull-up node PU, so that a voltage of the pull-up node PU is increased.

In some examples, as shown in FIGS. 7 and 8, the black frame insertion circuit 12 is electrically connected to the first clock signal terminal BCK1, the black frame insertion input signal terminal BI, the first voltage signal terminal VGL1, the second clock signal terminal BCK2 and the pull-up node PU. The black frame insertion circuit 12 is configured to, under control of a first clock signal transmitted by the first clock signal terminal BCK1, a black frame insertion input signal transmitted by the black frame insertion input signal terminal BI and a second clock signal transmitted by the second clock signal terminal BCK2, transmit the second clock signal to the pull-up node PU.

For example, in a case where the first clock signal is at a high level, the black frame insertion input signal is at a high level, and the second clock signal is at a high level, the black frame insertion circuit 12 may be turned on under the control of the first clock signal, the black frame insertion input signal and the second clock signal, and transmit the second clock signal to the pull-up node PU to charge the pull-up node PU. Therefore, the voltage of the pull-up node PU is increased.

The first voltage signal terminal VGL1 may be configured to transmit a direct current low level signal (e.g., lower than or equal to a low-level portion of a clock signal). For example, the first voltage terminal VGL1 is grounded.

In some examples, as shown in FIGS. 7 and 8, the output circuit 13 is electrically connected to the pull-up node PU, the third clock signal terminal CLKD, the shift signal terminal CR, the fourth clock signal terminal CLKE and the first output signal terminal Oput1. The output circuit 13 is configured to: transmit a third clock signal received at the third clock signal terminal CLKD to the shift signal terminal CR under control of the voltage of the pull-up node PU, and transmit a fourth clock signal received at the fourth clock signal terminal CLKE to the first output signal terminal Oput1 under the control of the voltage of the pull-up node PU.

For example, in a case where the voltage of the pull-up node PU is a high level, the output circuit 13 may be turned on under the control of the voltage of the pull-up node PU; and the output circuit 13 outputs the third clock signal received at the third clock signal terminal CLKD from the shift signal terminal CR as a shift signal, and outputs the fourth clock signal received at the fourth clock signal terminal CLKE from the first output signal terminal Oput1 as a first output signal at the same time.

In this case, pixel driving circuits in a same row of sub-pixels P are electrically connected to a same gate line GL. A first output signal terminal Oput1 of a single shift register 1 may be electrically connected to first scan signal terminals G1 and second scan signal terminals G2 of pixel driving circuits in a corresponding row of sub-pixels P through a gate line GL, so that a first output signal output by the first output signal terminal Oput1 may be transmitted to the first scan signal terminals G1 and the second scan signal terminals G2 of the pixel driving circuits through the gate line GL. The first output signal may be used as the first scan signal, and may also be used as the second scan signal.

Figure 9:
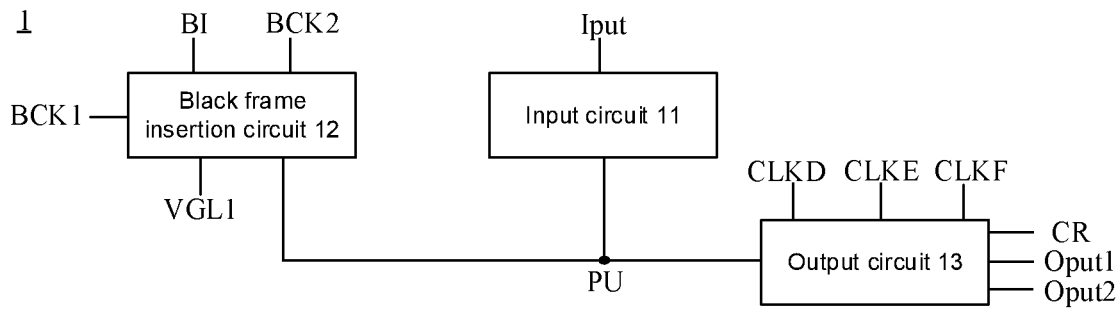
FIG. 9 is a structural diagram of another shift register, in accordance with some embodiments of the present disclosure.
Figure 10:
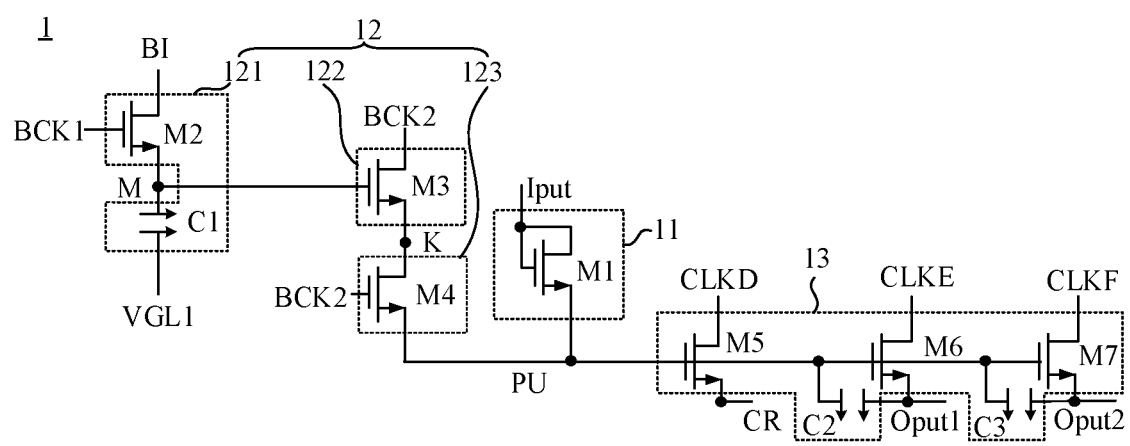
FIG. 10 is a circuit diagram of another shift register, in accordance with some embodiments of the present disclosure.

Optionally, as shown in FIGS. 9 and 10, the shift register 1 may further include a fifth clock signal terminal CLKF and a second output signal terminal Onput2 (represented by "Oput2" in the accompanying drawings and the following description). The output circuit 13 may further be electrically connected to the fifth clock signal terminal CLKF and the second output signal terminal Oput2. The output circuit 13 is further configured to transmit a fifth clock signal received at the fifth clock signal terminal CLKF to the second output signal terminal Oput2 under the control of the voltage of the pull-up node PU.

For example, in a case where the voltage of the pull-up node PU is at a high level, the output circuit 13 may be turned on under the control of the voltage of the pull-up node PU, and output the fifth clock signal received at the fifth clock signal terminal CLKF from the second output signal terminal Oput2 as a second output signal.

In this case, pixel driving circuits in a same row of sub-pixels P are electrically connected to two gate lines GL. A first output signal terminal Oput1 of a single shift register 1 may be electrically connected to first scan signal terminals G1 of pixel driving circuits in a corresponding row of sub-pixels P through one of two gate lines GL, and a first output signal output by the first output signal terminal Oput1 may be transmitted to the first scan signal terminals G1 of the pixel driving circuits through the gate line GL as a first scan signal. A second output signal terminal Oput2 of the shift register 1 may be electrically connected to second scan signal terminals G2 of the pixel driving circuits in the corresponding row of sub-pixels P through another of the two gate line GL, and a second output signal output by the second output signal output Oput2 may be transmitted to the second scan signal terminals G2 of the pixel driving circuits through the another gate line GL as a second scan signal.

It will be noted that, in the embodiments of the present disclosure, the input circuit 11 and the black frame insertion circuit 12 are turned on at different times in the display period in the display phase of one frame.

For example, first scan signal terminals G1 and second scan signal terminals G2 of pixel driving circuits in a same row of sub-pixels P are electrically connected to a same gate line GL, so that a first output signal output by a first output signal terminal Oput1 electrically connected to the gate line GL corresponds to scan signals received by the first scan signal terminals G1 and the second scan signal terminals G2.

Figure 6:
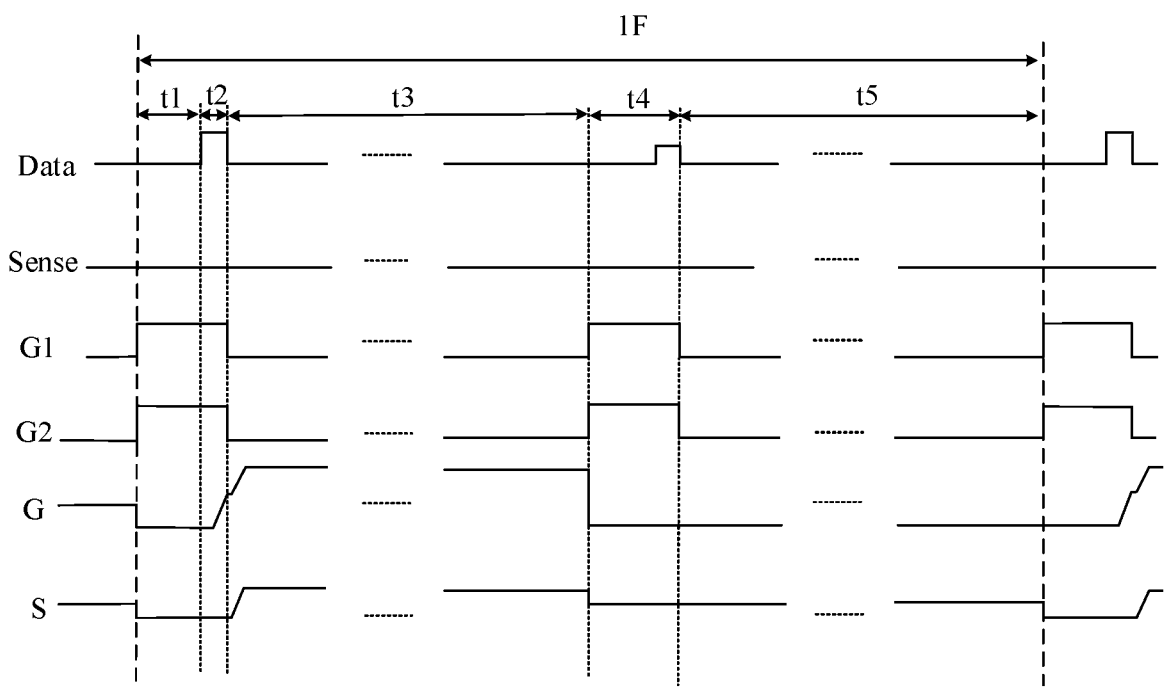
FIG. 6 is a timing diagram of the sub-pixel shown in FIG. 4, in accordance with some embodiments of the present disclosure.

In the display period in the display phase of one frame, the voltage of the pull-up node PU is first raised by the input circuit 11. After the input circuit 11 is turned on and charges the pull-up node PU, the output circuit 13 may be turned on under the control of the voltage of the pull-up node PU, and output the fourth clock signal from the first output signal terminal Oput1 as the first output signal. As shown in FIG. 6, in the reset phase t1 and the data writing phase t2, the input circuit 11 is turned off, the voltage of the pull-up node PU is maintained at a high level, the output circuit 13 is maintained in a turned-on state due to the voltage of the pull-up node PU, and the first output signal is at a high level. In the light-emitting phase t3, the voltage of the pull-up node PU is at a low level, the output circuit 13 is turned off, the first output signal is at a low level, and the driving transistor T2 is turned on under the control of the voltage of the first node G, so as to drive the light-emitting device to emit light. Correspondingly, the sub-pixels P perform image display.

At a certain moment (i.e., a moment at which the light-emitting phase t3 and the black frame insertion writing phase t4 as shown in FIG. 6 are switched) in the light-emitting process of the light-emitting device, the black frame insertion circuit 12 is turned on and charges the pull-up node PU, and the output circuit 13 may be turned on under the control of the voltage of the pull-up node PU. In this case, the fourth clock signal may be output from the first output signal terminal Oput1 as a black frame insertion signal, and is transmitted to a first scan signal terminal G1 and a second scan signal terminal G2 of a corresponding pixel driving circuit. The black frame insertion signal is at a high level, and the switching transistor T1 is turned on under control of the black frame insertion signal, so as to transmit a data signal (also referred to as a black frame insertion data signal) at a low level or a relative low level to the first Node G. The sensing transistor T3 is turned on under the control of the black frame insertion signal and transmits a low-level reset signal to the second node S. In this case, Vgs (i.e., a voltage difference between the first node G and the second node S) is less than Vth (i.e., a threshold voltage of the driving transistor T2), the sub-pixel P stops emitting light, and displays a black image. In the black frame insertion holding phase t5, the sub-pixels P continue to display a black image.

That is to say, in the embodiments of the present disclosure, by providing the black frame insertion circuit 12, it is possible to insert a black image during a process in which the sub-pixels P emit light for normal image display. Therefore, time for the sub-pixels P to emit light normally is shortened, and time for the display panel 1000 to display images normally is shortened. In this way, it is possible to increase motion picture response time (MPRT), ameliorate the phenomenon of motion picture smearing, and improve the effect of image display without increasing the refresh rate.

In addition, by controlling the moment at which the light-emitting phase t3 and the black frame insertion writing phase t4 are switched, a ratio of a duration in which the sub-pixel emits light normally to a duration in which the sub-pixel display a black image may be controlled, which facilitates the adjustment of MPRT. Thus, it is beneficial to ameliorate the phenomenon of motion picture smearing, and improve the effect of image display.

It will be noted that, the method for controlling the light-emitting process of the sub-pixels P to insert a black image varies, which may be set according to actual needs, and is not limited in the present disclosure.

The following description is made by taking an example in which first scan signal terminals G1 of pixel driving circuits in a same row of sub-pixels P are electrically connected to a gate line GL, and second scan signal terminals G2 of the pixel driving circuits in the same row of sub-pixels P are electrically connected to another gate line GL.

For example, in the process when the light-emitting device emits light, and the black frame insertion circuit 12 is turned on to charge the pull-up node PU, the black frame insertion signal (i.e., the first output signal) output by the first output signal terminal Oput1 may be at a high level, and the second output signal output by the second output signal terminal Oput2 may be at a low level. The switching transistor T1 is turned on under the control of the black frame insertion signal, and transmits a data signal (also referred to as a black frame insertion data signal) at a low level or a relative low level to the first node G, so that the driving transistor T2 is turned off under the control of the voltage of the first node G. Thus, the sub-pixel P stops emitting light, and displays a black image.

For another example, in the process when the light-emitting device emits light, and the black frame insertion circuit 12 is turned on to charge the pull-up node PU, the first output signal output by the first output signal terminal Oput1 may be at a low level, and the black frame insertion signal (i.e., the second output signal) output by the second output signal terminal Oput2 may be at a high level. The sensing transistor T3 is turned on under the control of the black frame insertion signal, and transmits a sensing signal (also referred to as a black frame insertion sensing signal) at a high level or a relative high level to the second node S, so that Vgs is less than Vth, and the driving transistor T2 is turned off. Thus, the sub-pixel P stops emitting light, and displays a black image.

For example, a time period during which the input circuit 11 is turned on may be referred to as a display sub-period, and a time period during which the black frame insertion circuit 12 is turned on may be referred to as a black frame insertion sub-period. The display sub-period and the black frame insertion sub-period are performed in sequence.

It will be noted that, for the plurality of shift registers 1 that are connected in cascade to constitute the scan driving circuit 100, except for the last few shift registers 1 (e.g., the last one, the last two or the last four shift registers 1), a shift signal terminal CR of each shift register 1 may be electrically connected to a scan input signal terminal Iput of a subsequent shift register 1, so that a shift signal output by each shift register 1 may be used as a scan input signal of the subsequent shift register 1.

Figure 19A:
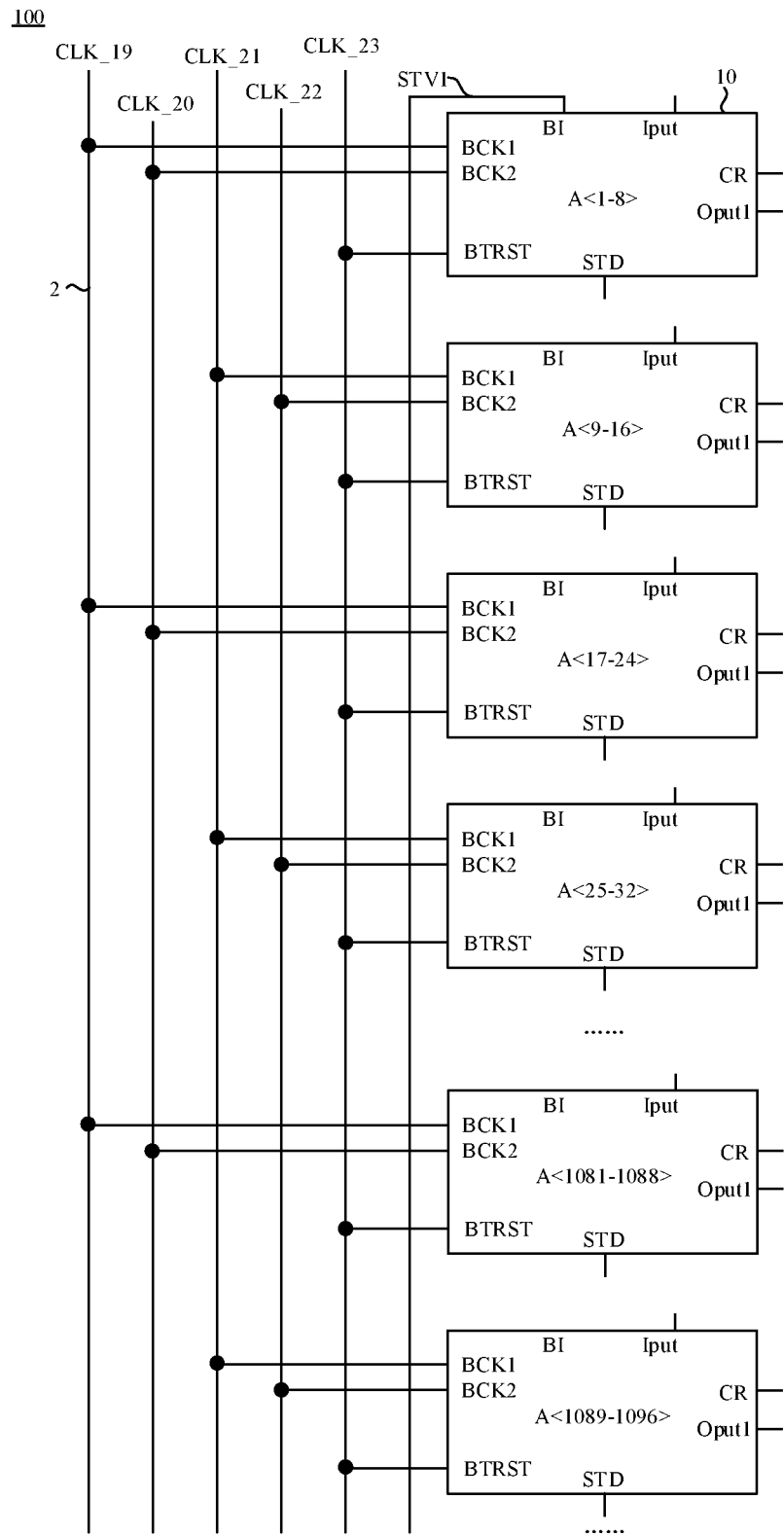
FIG. 19A is a structural diagram of yet another scan driving circuit, in accordance with some embodiments of the present disclosure.

Correspondingly, scan input signal terminals Iput of part of the shift registers 1 may be electrically connected to a first initial signal line STV1 (e.g., as shown in FIG. 19A), so that a first initial signal transmitted by the first initial signal line STV1 may be used as a scan input signal. The part of the shift registers 1 may include, for example, a first shift register 1 in the scan driving circuit 100. Alternatively, the part of the shift registers 1 may include, for example, a first shift register 1 to a fourth shift register 1 in the scan driving circuit 100. In this way, cascaded display may be realized.

Except for the last few shift registers 1 (e.g., the last two or the last eight shift registers 1), a shift signal terminal CR of each shift register 1 may further be electrically connected to a black frame insertion input signal terminal BI of a subsequent shift register 1, so that the shift signal output by each shift register 1 may be used as a black frame insertion signal of the subsequent shift register 1.

Correspondingly, black frame insertion input signal terminals BI of part of the shift registers 1 may be electrically connected to a second initial signal line, so that a second initial signal transmitted by the second initial signal line may be used as a black frame insertion input signal. The part of the shift registers 1 may include, for example, the first shift register 1 to the fourth shift register 1 in the scan driving circuit 100. Alternatively, the part of the shift registers 1 may include the first shift register 1 to an eighth shift register 1 in the scan driving circuit 100. In this way, cascaded black frame insertion may be realized.

In addition, for example, a shift signal terminal CR connected to the scan input signal terminal Iput and a shift signal terminal CR connected to the black frame insertion signal terminal BI belong to different shift registers 1. Therefore, it may be possible to avoid a situation that an input circuit 11 and a black frame insertion circuit 12 in a same shift register 1 that are connected to a same shift signal terminal CR are turned on synchronously, and in turn avoid a situation that a process of normal image display is in conflict with a process of inserting a black image.

Figure 15:
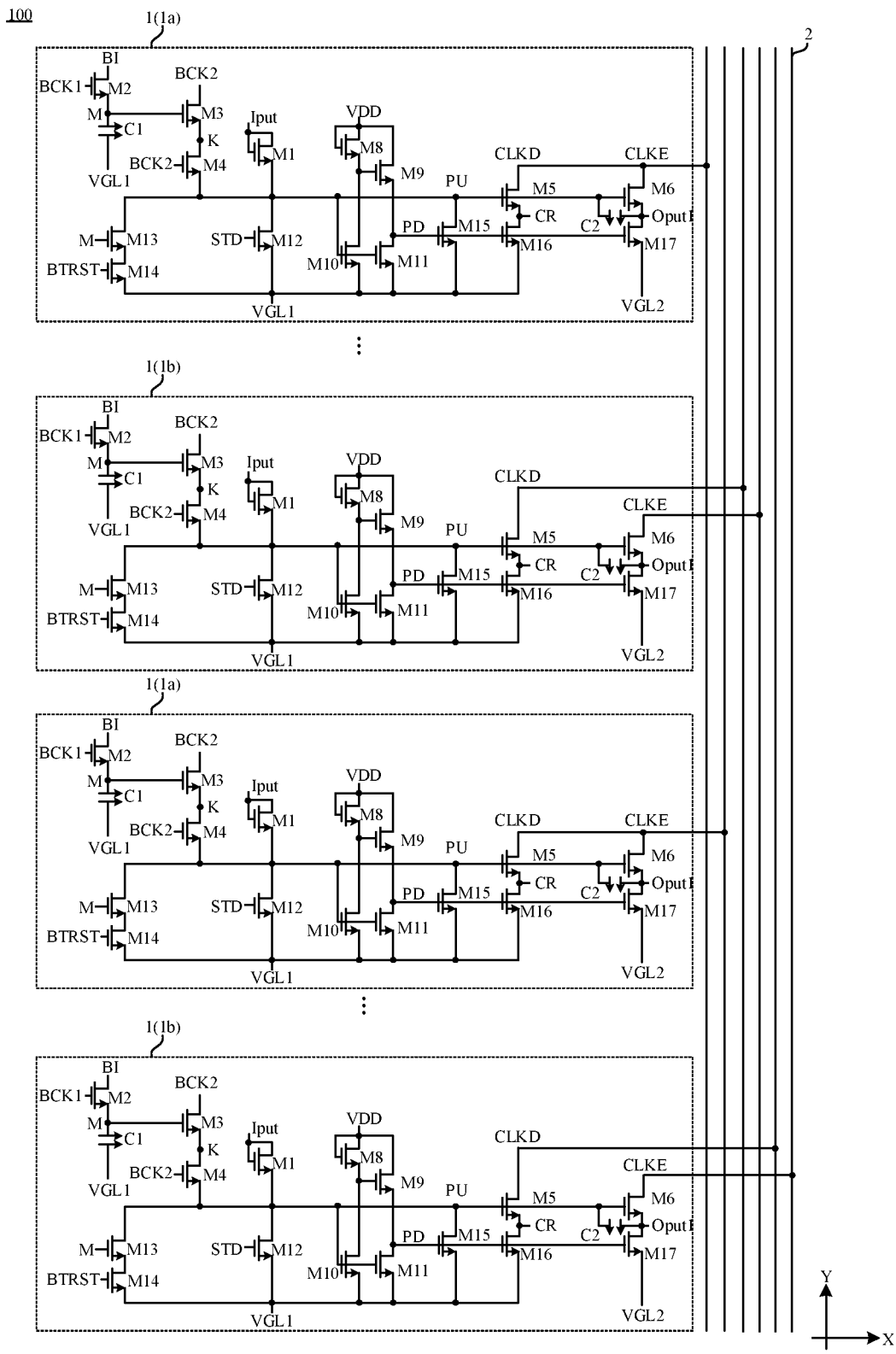
FIG. 15 is a structural diagram of a scan driving circuit, in accordance with some embodiments of the present disclosure.

In some examples, as shown in FIG. 15, the scan driving circuit 100 further includes a plurality of clock signal lines 2. The plurality of clock signal lines 2 may extend in the second direction Y.

For example, a clock signal terminal (e.g., the first clock signal terminal BCK1, the second clock signal terminal BCK2, the third clock signal terminal CLKD or the fourth clock signal terminal CLKE) may be electrically connected to a clock signal line 2, so as to receive a clock signal transmitted by the clock signal line 2.

In some examples, as shown in FIG. 15, the plurality of shift registers 1 included in the scan driving circuit 100 may include first shift registers 1a and second shift registers 1b.

For example, as shown in FIG. 15, a third clock signal terminal CLKD and a fourth clock signal terminal CLKE of a first shift register 1a are electrically connected to a same clock signal line 2. A third clock signal terminal CLKD and a fourth clock signal terminal CLKE of a second shift register 1b are electrically connected to different clock signal lines 2.

That is, the third clock signal terminal CLKD and the fourth clock signal terminal CLKE of the first shift register 1a share a same clock signal line 2, and a shift signal output and a first output signal output by an output circuit 13 in the first shift register 1a are the same signal, and have a same signal waveform. The third clock signal terminal CLKD and the fourth clock signal terminal CLKE of the second shift register 1b are connected to different clock signal lines 2, and a shift signal output and a first output signal output by an output circuit 13 in the second shift register 1b are different signals, and may have a same signal waveform or different signal waveforms.

By arranging the third clock signal terminal CLKD and the fourth clock signal terminal CLKE in the first shift register 1a to share the same clock signal line 2, the number of clock signal lines 2 included in the scan driving circuit 100 may be effectively reduced.

In this case, scan input signal terminal(s) Iput of shift register(s) 1 (e.g., a first shift register 1a and/or a second shift register 1b) may be, for example, electrically connected to a shift signal terminal CR of a first shift register 1a, and black frame insertion input signal terminal(s) BI of the shift register(s) 1 (e.g., the first shift register 1a and/or the second shift register 1b) may be, for example, electrically connected to a shift signal terminal CR of a second shift register 1b, thereby avoiding the situation that the input circuit 11 and the black frame insertion circuit 12 in the same shift register 1 that are connected to the same shift signal terminal CR are turned on synchronously.

It will be noted that, in these examples, a shift signal terminal CR of a single second shift register 1b may be electrically connected to black frame insertion terminals BI of shift registers 1 (e.g., first shift register(s) 1a and/or second shift register(s) 1b). In this way, in the process of performing black image insertion, rows of sub-pixels P may stop emitting light synchronously and display a black image.

Therefore, in the scan driving circuit 100 provided in the embodiments of the present disclosure, by providing the black frame insertion circuit 12 in the shift register 1 included in the scan drive circuit 100, it may be possible to insert a black image in the process of normal image display of the sub-pixels P in the display panel 1000, so as to reduce normal light-emitting time of the sub-pixels P. Thus, the MPRT may be increased, the phenomenon of motion picture smearing may be ameliorated, and the effect of image display may be improved.

On this basis, by dividing the plurality of shift registers 1 included in the scan driving circuit 100, the third clock signal terminal CLKD and the fourth clock signal terminal CLKE of the first shift register 1a may be connected to the same clock signal line 2, the third clock signal terminal CLKD and the fourth clock signal terminal CLKE of the second shift register 1b are connected to different clock signal lines 2. Thus, it may realize cascaded display and cascaded black frame insertion, and avoid that cascaded display and cascaded black frame insertion are in conflict with each other. In addition, it may effectively reduce the number of clock signal lines 2, simplify the structure of the scan driving circuit 100, and reduce an area occupied by the scan driving circuit 100. As a result, yields of the scan driving circuit 100, and the display panel 1000 and the display apparatus 2000 that adopt the scan driving circuit 100 are improved.

It will be noted that, for example, the first shift registers 1a and the second shift registers 1b included in the scan driving circuit 100 may have a same structure. The arrangement manner of the first shift registers 1a and the second shift registers varies, which may be set according to actual needs.

Figure 18:
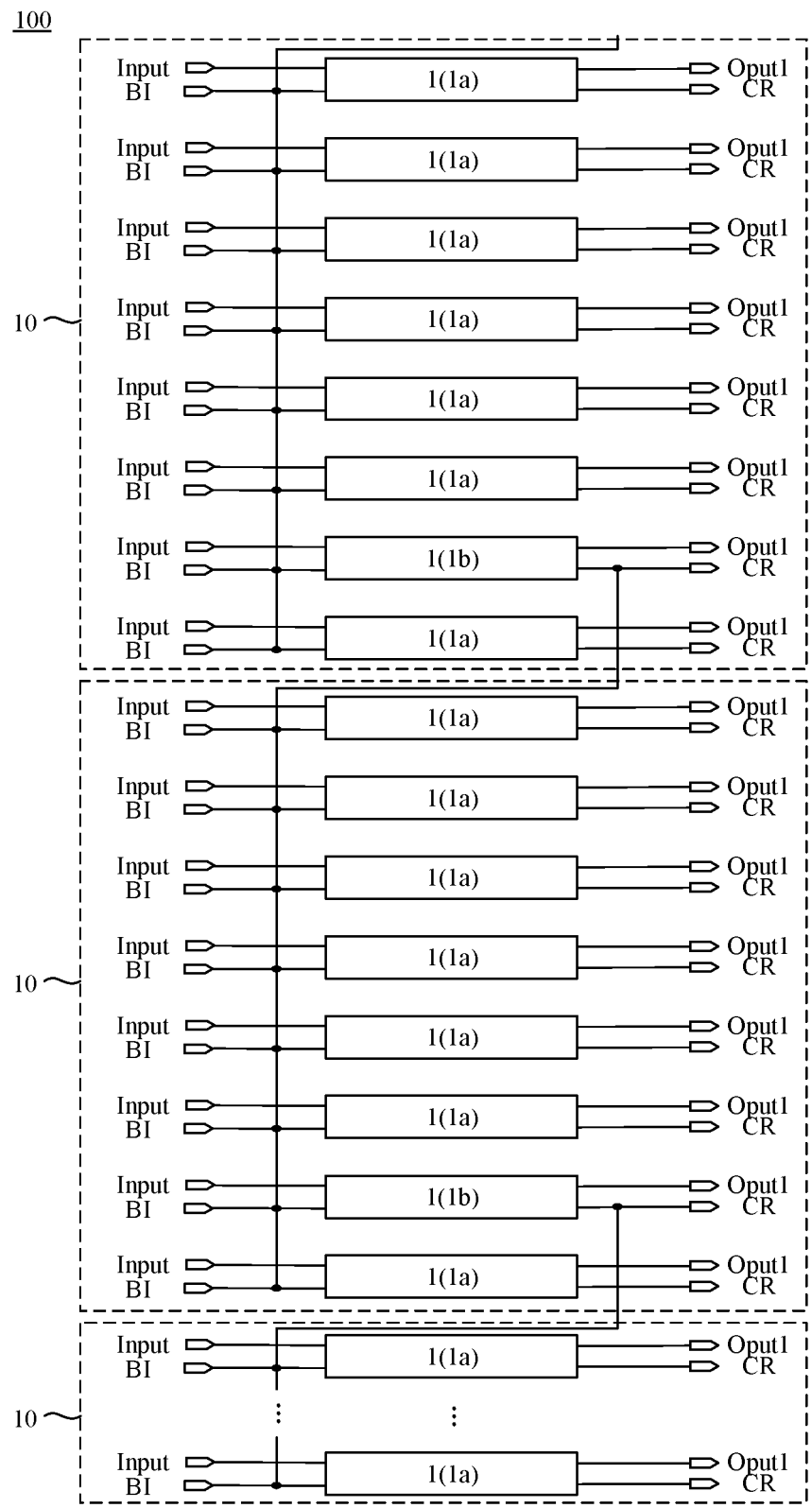
FIG. 18 is a structural diagram of yet another scan driving circuit, in accordance with some embodiments of the present disclosure.

In some embodiments, as shown in FIGS. 15 and 18, at least one first shift register 1a is arranged between any two adjacent second shift registers 1b.

In some examples, one first shift register 1a is arranged between any two adjacent second shift registers 1b. That is, the first shift registers 1a and the second shift registers 1b are alternately arranged in sequence.

In this case, the number of the first shift registers 1a and the number of the second shift registers 1b may be equal, or differ by one.

In some other examples, as shown in FIG. 18, two or more first shift registers 1a are arranged between any two adjacent second shift registers 1b.

In this case, the number of the first shift registers 1a is greater than the number of the second shift registers 1b.

In these examples, the number of first shift registers 1a arranged between any two adjacent second shift registers 1b may be equal or not equal, and which may be set according to actual needs.

For example, there are five first shift registers 1a arranged between any two adjacent second shift registers 1b.

For another example, there are seven first shift registers 1a arranged between any two adjacent second shift registers 1b.

By providing first shift register(s) 1a between any two adjacent second shift registers 1b, the distribution regularity between the first shift registers 1a and the second shift registers 1b may be improved, the difficulty of manufacturing the scan driving circuit 100 may be reduced, and a ratio of the number of the first shift registers 1a to the number of the second shift registers 1b may be effectively increased. The greater the number of the first shift registers 1a, the greater the number of shift registers 1 sharing the same clock signal line 2, the greater the reduction in the number of clock signal lines 2, and the greater the number of shift registers 1 electrically connected to the shift signal terminals CR of the second shift registers 1b. In this way, the number of the clock signal lines 2 included in the scan driving circuit 100 may be effectively reduced, the structure of the scan driving circuit 100 may be simplified, the yields of the scan driving circuit 100, and the display panel 1000 and the display apparatus 2000 that adopt the scan driving circuit 100 may be improved, the efficiency of black image insertion may also be improved, and the phenomenon of motion picture smearing may be effectively ameliorated.

In addition, for example, there may be no first shift register 1a arranged between some adjacent two second shift registers 1b, as long as a black image may be inserted during the process of normal image display of the sub-pixels P.

In some examples, as shown in FIG. 18, the plurality of shift registers 1 included in the scan driving circuit 100 may be divided into a plurality of shift register groups 10. A shift register group 10 includes at least one first shift register 1a and at least one second shift register 1b.

The number of shift registers 1 included in each shift register group 10 may be equal or may not be equal.

The arrangement manner of the first shift register(s) 1a and the second shift register(s) 1b in the shift register group 10 varies.

For example, the shift register group 10 includes one first shift register 1a and one second shift register 1b.

For example, the shift register group 10 includes one first shift register 1a and multiple second shift registers 1b.

For example, the shift register group 10 includes multiple first shift registers 1a and one second shift register 1b.

For example, the shift register group 10 includes multiple first shift registers 1a and multiple second shift registers 1b.

In some examples, as shown in FIG. 18, a shift signal terminal CR of a second shift register 1b in an M-th shift register group 10 is electrically connected to a black frame insertion input signal terminal BI of at least one shift register 1 in an (M+i)-th shift register group 10. Here, M and i are both positive integers, and i is less than M (i<M).

For example, the shift signal terminal CR of the second shift register 1b in the M-th shift register group 10 may be electrically connected to a black frame insertion input signal terminal BI of a single shift register 1 in the (M+i)-th shift register group 10.

In this case, the M-th shift register group 10 may include multiple second shift registers 1b, which may be electrically connected to black frame insertion input signal terminals BI of shift registers 1 in the (M+i)-th shift register group 10.

For example, the shift signal terminal CR of the second shift register 1*b* in the M-th shift register group 10 may be electrically connected to black frame insertion input terminals BI of at least two shift registers 1 in the (M+i)-th shift register group 10.

In this case, the number of second shift registers 1*b* included in the M-th shift register group 10 may be small, which is conducive to reducing the number of clock signal lines 2 and simplifying the structure of the scan driving circuit 100.

It will be noted that, the cascaded relationship between the shift signal terminal CR of the second shift register 1*b* and black frame insertion input signal terminal(s) BI of shift register(s) 1 is not limited to the situations exemplified in the above examples, as long as the shift register groups 10 can realize cascaded black frame insertion.

The value of i may be set according to actual needs, which is not limited in the present disclosure.

For example, i is equal to 1 (i=1). In this case, as shown in FIG. 18, the shift signal terminal CR of the second shift register 1*b* in the M-th shift register group 10 may be electrically connected to the black frame insertion input signal terminal BI of at least one shift register 1 in the (M+1)-th shift register group 10. That is, for any two adjacent shift register groups 10, a shift signal terminal CR and black frame insertion input signal terminal(s) BI have a cascaded black frame insertion relationship.

For example, i is equal to 2 (i=2). In this case, the shift signal terminal CR of the second shift register 1*b* in the M-th shift register group 10 may be electrically connected to the black frame insertion input signal terminal BI of at least one shift register 1 in the (M+2)-th shift register group 10. That is, for any two adjacent odd-numbered shift register groups 10, a shift signal terminal CR and black frame insertion input signal terminal(s) BI have a cascaded black frame insertion relationship; and for any two adjacent even-numbered shift register groups 10, a shift signal terminal CR and black frame insertion input signal terminal(s) BI have a cascaded black frame insertion relationship.

In some examples, as shown in FIG. 18, considering an example where the shift register group 10 includes multiple first shift registers 1*a* and a single second shift register 1*b*, the shift signal terminal CR of the second shift register 1*b* in the M-th shift register group may be electrically connected to the black frame insertion input signal terminals BI of all shift registers 1 in the (M+i)-th shift register group 10.

In this case, the shift signal output by the second shift register 1*b* in the M-th shift register group 10 may be transmitted to the black frame insertion input signal terminals BI of the shift register 1 in the (M+i)-th shift register group 10 at the same time, so that the shift registers 1 in the (M+i)-th shift register group 10 may synchronously output black frame insertion signals (e.g., first output signals and/or second output signals). As a result, rows of sub-pixels P corresponding to the (M+i)-th shift register group 10 may realize the black image insertion synchronously, so as to improve the efficiency of the black image insertion.

In each shift register group 10, only one shift register is the second shift register 1*b*, and the remaining shift registers are first shift registers 1*a* whose third clock signal terminals CLKD and fourth clock signal terminals CLKE share a same clock signal line 2. Therefore, the number of the clock signal lines 2 may be further reduced, and the structure of the scan driving circuit 100 may be further simplified.

It will be noted that, third clock signal terminals CLKD of second shift registers 1*b* in the plurality of shift register groups 10 are connected to multiple clock signal lines 2.

That is, third clock signal terminals CLKD of second shift registers 1*b* in part of the plurality of shift register groups 10 may be connected a same clock signal line 2, and third clock signal terminals CLKD of second shift registers 1*b* in another part of the plurality of shift register groups 10 may be connected to a same clock signal line 2, but the clock signal line 2 connected to the third clock signal terminals CLKD of the second shift registers 1*b* in the part of the plurality of shift register groups 10 and the clock signal line 2 connected to the third clock signal terminals CLKD of the second shift registers 1*b* in the another part of the plurality of shift register groups 10 are different.

In this way, sub-pixels P corresponding to different shift register groups 10 may perform the black image insertion in sequence, so as to avoid a situation that the sub-pixels P corresponding to the plurality of shift register groups 10 perform the black image insertion synchronously, and ensure the display effect of the display panel 1000 and the display apparatus 2000 that adopt the scan driving circuit 100.

Figure 19B:
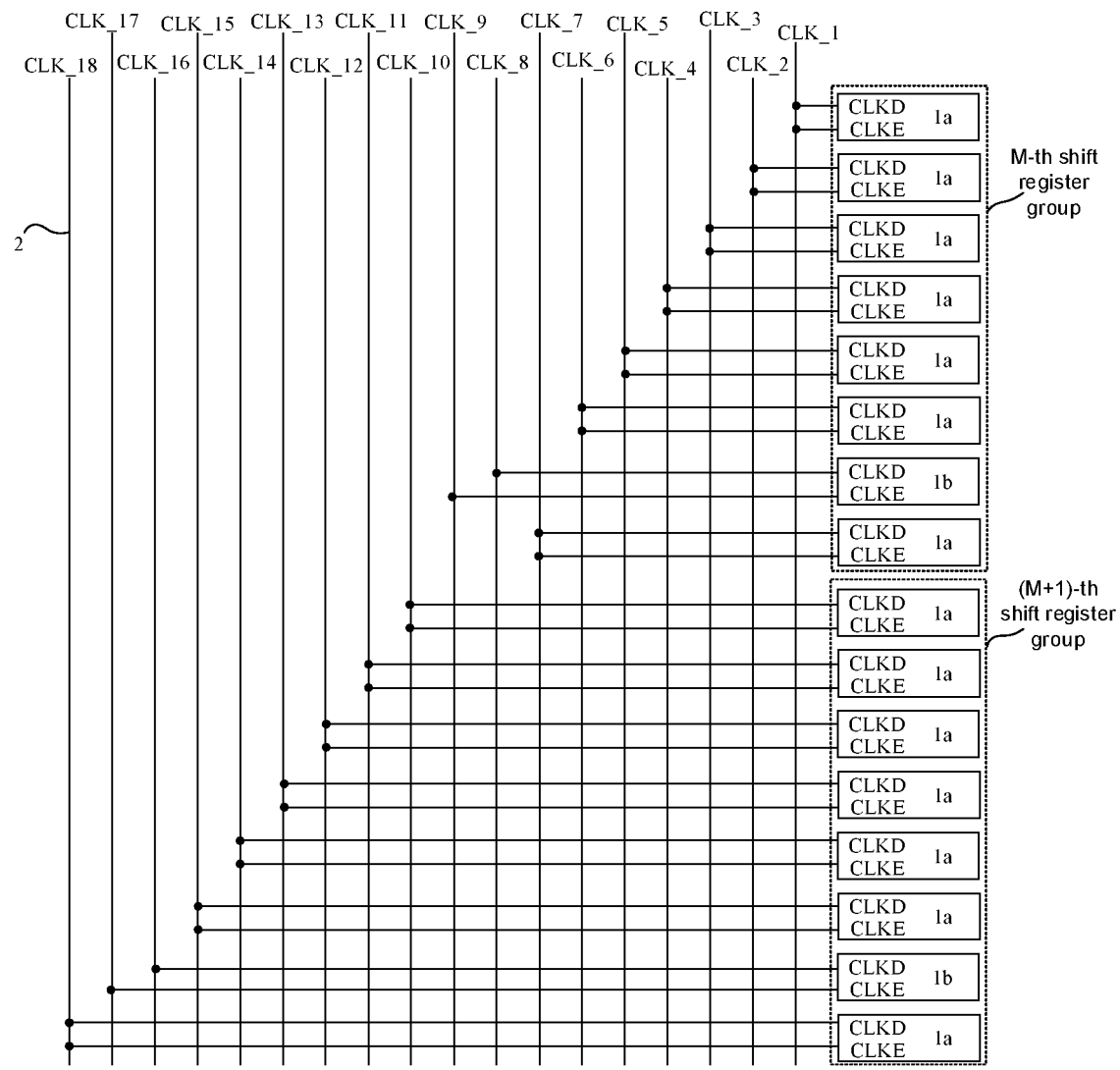
FIG. 19B is a structural diagram of yet another scan driving circuit, in accordance with some embodiments of the present disclosure.
Figure 20:
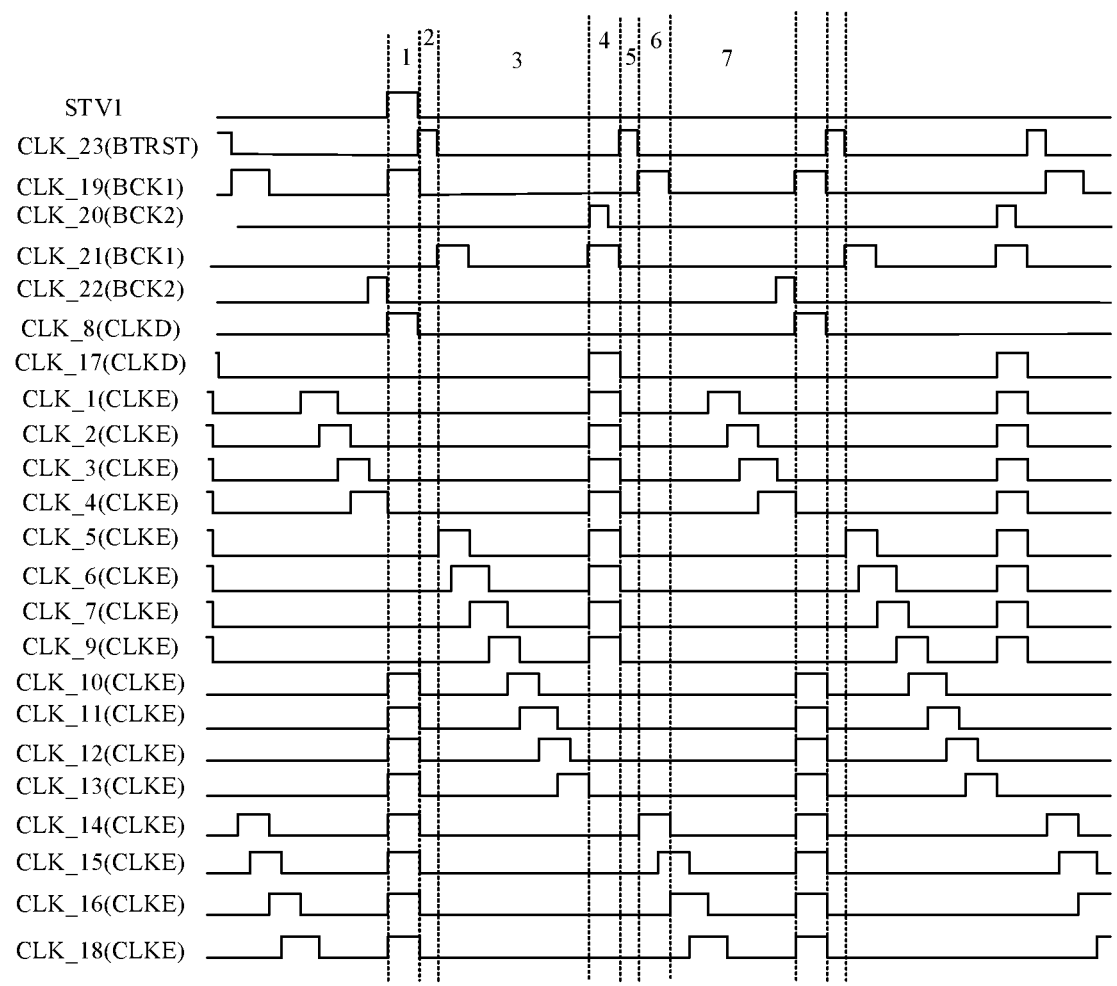
FIG. 20 is a timing diagram of a scan driving circuit, in accordance with some embodiments of the present disclosure.

In some examples, as shown in FIG. 19B, the third clock signal terminal CLKD of the second shift register 1*b* in the M-th shift register group 10 and the third clock signal terminal CLKD of the second shift register 1*b* in the (M+i)-th shift register group 10 are electrically connected to different clock signal lines 2.

In this way, it is possible to avoid that sub-pixels P corresponding to the M-th shift register group 10 and sub-pixels P corresponding to the (M+i)-th shift register group 10 perform the black image insertion synchronously, and ensure the display effect of the display panel 1000 and the display apparatus 2000 that adopt the scan driving circuit 100.

For example, in a case where i=1, clock signal lines 2 connected to third clock signal terminals CLKD of second shift registers 1*b* in any two adjacent shift register groups 10 are different.

For example, in a case where i=2, clock signal lines 2 connected to third clock signal terminals CLKD of second shift registers 1*b* in any two adjacent odd-numbered shift register groups 10 are different, and clock signal lines 2 connected to third clock signal terminals CLKD of second shift registers 1*b* in any two adjacent even-numbered shift register groups 10 are different.

The following description is made by taking an example in which the shift register group 10 includes multiple first shift registers 1*a* and a single second shift register 1*b*.

For example, in a case where i=1, third clock signal terminals CLKD of any two adjacent second shift registers 1*b* are connected to different clock signal lines 2. Of course, third clock signal terminals CLKD of two second shift registers 1*b* that are not adjacent may be connected to a same clock signal line 2 or different clock signal lines 2, and details will not be limited in the embodiments of the present disclosure.

For example, in a case where i=2, third clock signal terminals CLKD of any two adjacent odd-numbered second shift registers 1*b* are connected to different clock signal lines 2, and third clock signal terminals CLKD of any two adjacent even-numbered second shift registers 1*b* are connected to different clock signal lines 2.

By adopting the above arrangement manner, it is possible to reduce the number of the clock signal lines 2, and avoid a situation that sub-pixels P corresponding to two adjacent shift register groups 10 perform the black image insertion synchronously. As a result, the display effect of the display panel 1000 and the display apparatus 2000 that adopt the scan driving circuit 100 is ensured.

In some examples, the third clock signal terminal CLKD of the second shift register 1b in the M-th shift register group 10 and a third clock signal terminal CLKD of a second shift register 1b in an (M+i+1)-th shift register group 10 are electrically connected to a same clock signal line 2.

That is to say, in a case where the shift register group 10 includes multiple second shift registers 1b, the third clock signal terminals CLKD of the second shift registers 1b in the same shift register group 10 are connected to a same clock signal line 2. The number of clock signal lines 2 electrically connected to the third clock signal terminals CLKD of the second shift registers 1b is related to i.

For example, in a case where i=1, third clock signal terminals CLKD of second shift registers 1b in the odd-numbered shift register groups 10 are connected to a same clock signal line 2, and third clock signal terminals CLKD of second shift registers 1b in the even-numbered shift register groups 10 are connected to a same clock signal line 2. In this case, the number of clock signal lines 2 electrically connected to third clock signal terminals CLKD of all second shift registers 1b may be reduced to two.

For example, in a case where i=2, the number of clock signal lines 2 electrically connected to the third clock signal terminals CLKD of all second shift registers 1b may be reduced to three.

In this way, on the basis of increasing the MPRT, it is possible to further reduce the number of the clock signal lines 2, simplify the structure of the scan driving circuit 100, and improve the yields of the scan driving circuit 100, and the display panel 1000 and the display apparatus 2000 that adopt the scan driving circuit 100.

It will be noted that, the number of clock signal lines 2 electrically connected to fourth clock signal terminals CLKE of the plurality of shift registers 1 included in the scan driving circuit 100 is greater than the number of clock signal lines 2 electrically connected to third clock signal terminals CLKD of shift registers 1b included in the plurality of shift registers 1, and a difference between the two numbers is 2N or 3N, N being a positive integer.

For example, clock signal lines 2 electrically connected to the fourth clock signal terminals CLKE of all the shift register 1 may be referred to as scan clock signal lines. The third clock signal terminal CLKD and the fourth clock signal terminal CLKE of each first shift register 1a share, for example, a single scan clock signal line. Clock signal lines 2 electrically connected to the third clock signal terminals CLKD of all the second shift registers 1b may be referred to as black frame insertion clock signal lines.

A difference between the number of clock signal lines 2 electrically connected to the fourth clock signal terminals CLKE of the plurality of shift registers 1 included in the scan driving circuit 100 and the number of clock signal lines 2 electrically connected to the third clock signal terminals CLKD of the second shift registers 1b included in the plurality of shift registers 1 is related to the cascaded black frame insertion relationship.

For example, in a case where i=1, the difference between the number of clock signal lines 2 electrically connected to the fourth clock signal terminals CLKE of the plurality of shift registers 1 included in the scan driving circuit 100 and the number of clock signal lines 2 electrically connected to the third clock signal terminals CLKD of the second shift registers 1b included in the plurality of shift registers 1 may be 2N.

For example, in a case where i=2, the difference between the number of clock signal lines 2 electrically connected to the fourth clock signal terminals CLKE of the plurality of shift registers 1 included in the scan driving circuit 100 and the number of clock signal lines 2 electrically connected to the third clock signal terminals CLKD of the second shift registers 1b included in the plurality of shift registers 1 may be 3N.

By setting the number of the scan clock signal lines to be greater than the number of the black frame insertion clock signal lines, it may be possible to effectively reduce the number of clock signal lines 2, simplify the structure of the scan driving circuit 100, and improve the yields of the scan driving circuit 100, and the display panel 1000 and the display apparatus 2000 that adopt the scan driving circuit 100.

In some examples, as shown in FIG. 19A, the first clock signal terminals BCK1 of the shift registers 1 in the same shift register group 10 are electrically connected to a same clock signal line 2. The second clock signal terminals BCK2 of the shift registers 1 in the same shift register group 10 are electrically connected to a same clock signal line 2.

In this case, the first clock signal terminals BCK1 of the shift registers 1 in the same shift register group 10 may synchronously receive the first clock signal. The second clock signal terminals BCK2 of the shift registers 1 in the same shift register group 10 may synchronously receive the second clock signal.

In a case where the black frame insertion input signal terminals BI of the shift registers 1 in the same shift register group 10 synchronously receive a black frame insertion input signal transmitted by a previous shift register group 10, the black frame insertion circuits 12 in the shift registers 1 in the same shift register group 10 may be synchronously turned on under control of the first clock signal, the second clock signal and the black frame insertion signal, so that the shift registers 1 in the same shift register group 10 may output black frame insertion signals (e.g., first output signals and/or second output signals) at the same time, and corresponding rows of sub-pixels P perform the black image insertion synchronously.

For example, the first clock signal terminals BCK1 of the shift registers 1 in the M-th shift register group 10 and the first clock signal terminals BCK1 of the shift registers 1 in the (M+i)-th shift register group 10 are electrically connected to different clock signal lines 2. The second clock signal terminals BCK2 of the shift registers 1 in the M-th shift register group 10 and the second clock signal terminals BCK2 of the shift registers 1 in the (M+i)-th shift register group 10 are electrically connected to different clock signal lines 2.

In a case where the shift signal terminal CR of the second shift register 1b in the M-th shift register group 10 is electrically connected to the black frame insertion input signal terminal BI of at least one shift register 1 in the (M+i)-th shift register group 10, by adopting the above arrangement manner, the shift registers 1 in the M-th shift register group 10 and the shift registers 1 in the (M+i)-th shift register group 10 may output black frame insertion signals (e.g., first output signals and/or second output signals) in different time periods. Thus, the sub-pixels P corresponding to the M-th shift register group 10 and the sub-pixels P corresponding to the (M+i)-th shift register group 10 may perform the black image insertion in different time periods, which ensures the display effect of the display panel 1000 and the display apparatus 2000 that adopt the scan driving circuit 100.

For example, in a case where i=1, black frame insertion circuits 12 in any two adjacent shift register groups 10 are connected to different clock signal lines 2. Of course, black frame insertion circuits 12 in two second shift registers 1b that are not adjacent may be connected to a same clock signal line 2 or different clock signal lines 2, which is not limited in the embodiments of the present disclosure.

For example, in a case where i=2, black frame insertion circuits 12 in any two adjacent odd-numbered shift register groups 10 are connected to different clock signal lines 2, and black frame insertion circuits 12 in any two adjacent even-numbered shift register groups 10 are connected to different clock signal lines 2.

By adopting the above arrangement manner, the number of clock signal lines 2 may be reduced, a situation that the black frame insertion circuits 12 in any two adjacent shift register groups 10 or any two adjacent odd-numbered (or even-numbered) shift register groups 10 are simultaneously turned on may be avoid, and in turn, a situation that the sub-pixels P corresponding to two adjacent shift register groups 10 perform the black image insertion synchronously is avoid, so that the display effect of the display panel 1000 and the display apparatus 2000 that adopt the scan driving circuit 100 is ensured.

For example, the first clock signal terminals BCK1 of the shift registers 1 in the M-th shift register group 10 and the first clock signal terminals BCK1 of the shift registers 1 in the (M+i+1)-th shift register group 10 are electrically connected to a same clock signal line 2. The second clock signal terminals BCK2 of the shift registers 1 in the M-th shift register group 10 and the second clock signal terminals BCK2 of the shift registers 1 in the (M+i+1)-th shift register group 10 are electrically connected to a same clock signal line 2.

That is to say, in a same shift register group 10, the first clock signal terminals BCK1 of the shift registers 1 are connected to the same clock signal line 2, and the second clock signal terminals BCK2 of the shift registers 1 are connected to the same clock signal line 2.

For example, in a case where i=1, first clock signal terminals BCK1 of shift registers 1 included in all odd-numbered shift register groups 10 are connected to a same clock signal line 2, and second clock signal terminals BCK2 of shift registers 1 included in all odd-numbered shift register groups 10 are connected to a same clock signal line 2; first clock signal terminals BCK1 of the shift registers 1 included in all the even-numbered shift register groups 10 are connected to a same clock signal line 2, and second clock signal terminals BCK2 of the shift registers 1 included in all the even-numbered shift register groups 10 are connected to a same clock signal line 2.

In this case, a minimum number of clock signal lines 2 connected to first clock signal terminals BCK1 of all the shift registers 1 may be two, and a minimum number of clock signal lines 2 connected to second clock signal terminals BCK2 of all the shift registers 1 may also be two.

In this way, it may be possible to further reduce the number of clock signal lines 2, further simplify the structure of the scan driving circuit 100, further improve the yields of the scan driving circuit 100, and the display panel 1000 and the display apparatus 2000 that adopt the scan driving circuit 100.

It will be noted that, the arrangement of the shift registers 1 in a same shift register group 10 varies, which may be set according to actual needs.

In some embodiments, one shift register 1 of the shift registers 1 included in the shift register group 10 includes one black frame insertion circuit 12.

Figure 16:
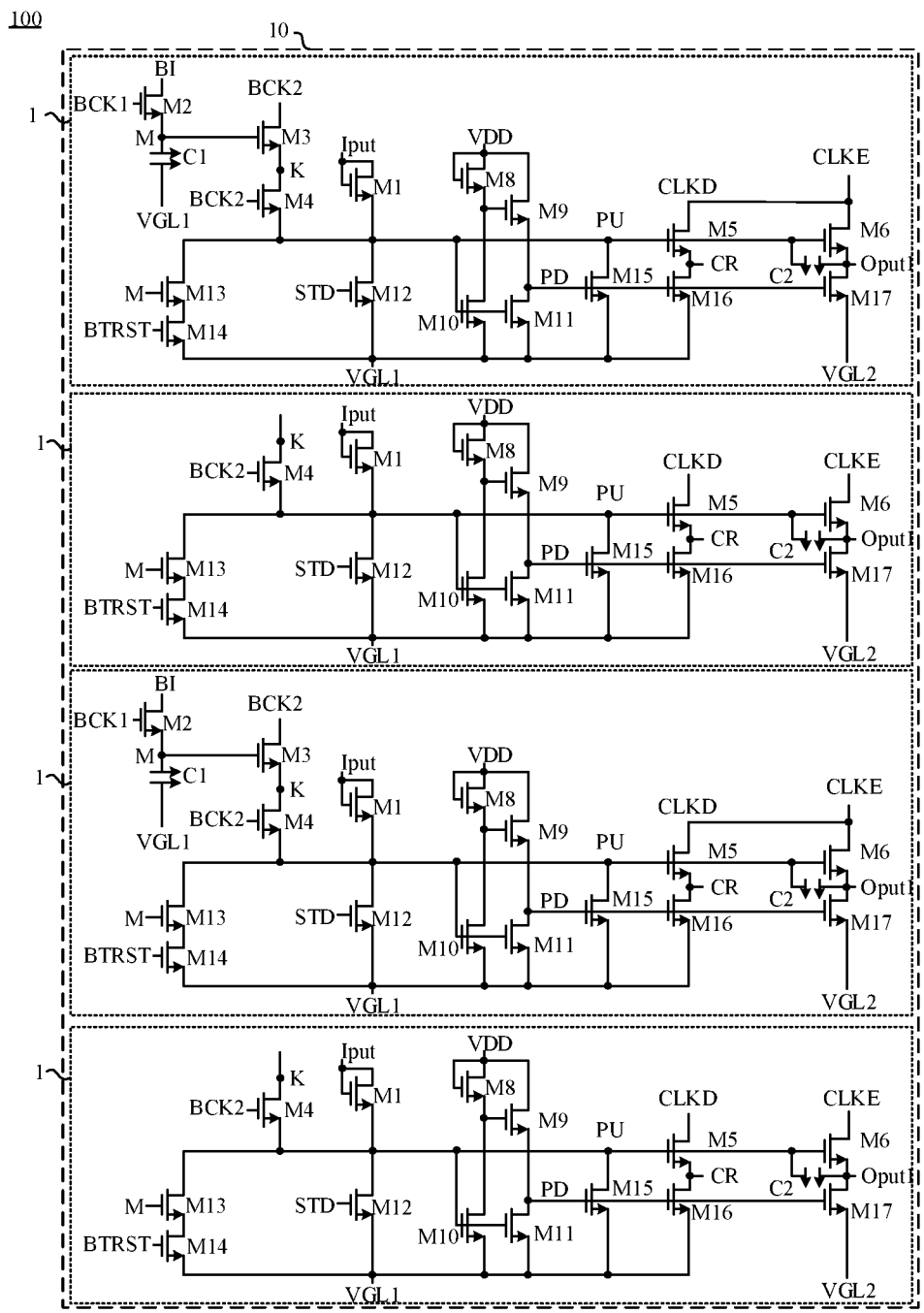
FIG. 16 is a structural diagram of another scan driving circuit, in accordance with some embodiments of the present disclosure.
Figure 17:
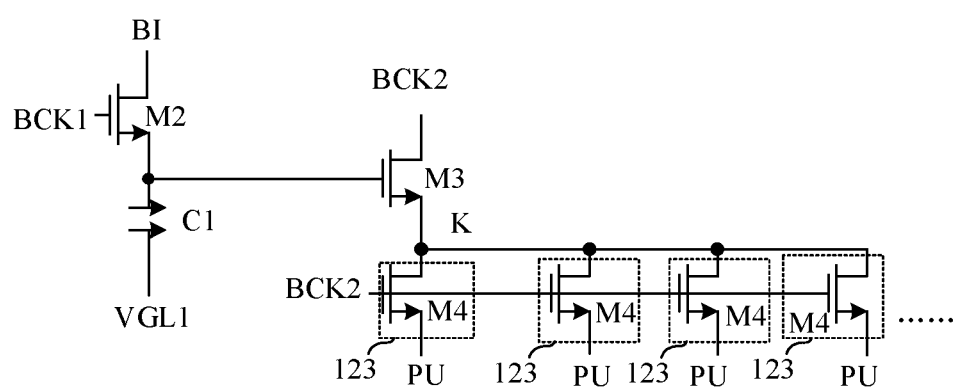
FIG. 17 is a circuit diagram of a black frame insertion circuit, in accordance with some embodiments of the present disclosure.

In some other embodiments, as shown in FIGS. 16 and 17, at least two shift registers 1 of the shift registers 1 included in the shift register group 10 share one black frame insertion circuit 12.

In some examples, the shift register group 10 includes two shift registers 1. In this case, the two shift registers 1 may share one black frame insertion circuit 12.

In some other examples, the shift register group 10 includes shift registers 1.

Optionally, any two, three or more adjacent shift registers 1 of the shift registers 1 included in the shift register group 10 may share one black frame insertion circuit 12.

Optionally, the shift registers 1 included in the shift register group 10 may share one black frame insertion circuit 12.

By arranging the shift registers 1 included in the same shift register group 10, at least two shift registers 1 share one black frame insertion circuit 12, which is conducive to reducing the number of black frame insertion circuits in the shift register groups 10, simplifying the structure of the scan driving circuit 100, and improving the yield of the scan driving circuit 100.

In addition, by adopting the above arrangement manner, it may be possible to control the shift registers 1 included in the same shift register group 10 by using a small number of black frame insertion circuits 12, and it is beneficial to reduce a difficulty of synchronously outputting black frame insertion signals by the plurality of shift registers 1.

In some embodiments, as shown in FIG. 8, a black frame insertion circuit 12 may include a black frame insertion control sub-circuit 121, a black frame insertion input sub-circuit 122 and a black frame insertion transmission sub-circuit 123.

In some examples, as shown in FIG. 8, the black frame insertion control sub-circuit 121 may be electrically connected to the first clock signal terminal BCK1, the black frame insertion input signal terminal BI, the first voltage signal terminal VGL1 and a first black frame insertion node M. The black frame insertion control sub-circuit 121 is configured to transmit the black frame insertion input signal transmitted by the black frame insertion input signal terminal BI to the first black frame insertion node M under the control of the first clock signal.

For example, in a case where the first clock signal is at a high level, the black frame insertion control sub-circuit 121 may be turned on under the control of the first clock signal, and transmit the black frame insertion input signal transmitted by the black frame insertion input signal terminal BI to the first black frame insertion node M, so as to charge the first black frame insertion node M. Thus, a voltage of the first black frame insertion node M rises.

In some examples, as shown in FIG. 8, the black frame insertion input sub-circuit 122 is electrically connected to the first black frame insertion node M, the second clock signal terminal BCK2 and a second black frame insertion node K. The black frame insertion input sub-circuit 122 is configured to transmit the second clock signal received at the second clock signal terminal BCK2 to the second black frame insertion node K under control of the voltage of the first black frame insertion node M.

For example, in a case where the black frame insertion control sub-circuit 121 is turned on to charge the first black frame insertion node M so that the voltage of the first black frame insertion node M rises, the black frame insertion input sub-circuit 122 may be turned on under the control of the voltage of the first black frame insertion node M, receive the second clock signal, and transmit the second clock signal to the second black frame insertion node K.

In some examples, as shown in FIG. 8, the black frame insertion transmission sub-circuit 123 is electrically connected to the second clock signal terminal BCK2, the second black frame insertion node K and the pull-up node PU. The black frame insertion transmission sub-circuit 123 is configured to transmit the second clock signal from the second black frame insertion node K to the pull-up node PU under control of the second clock signal.

For example, in a case where the second clock signal is at a high level, the black frame insertion transmission sub-circuit 123 may be turned on under the control of the second clock signal, and transmit the second clock signal from the second black frame insertion node K to the pull-up node PU. The second clock signal from the second black frame insertion node K is also at a high level, so that the pull-up node PU may be charged. Thus, the voltage of the pull-up node PU rises.

In consideration of the structure of the black frame insertion circuit 12, the arrangement of the black frame insertion circuit 12 shared by a same shift register group 10 varies, which may be set according to actual needs.

Here, the schematic description is made by taking an example where the shift registers 1 included in the same shift register group 10 share one black frame insertion circuit 12.

In some examples, the black frame insertion circuit 12 includes one black frame insertion transmission sub-circuit 123. The black frame insertion transmission sub-circuit 123 is electrically connected to pull-up nodes PU of the shift registers 1 included in the same shift register group 10.

In some other examples, as shown in FIG. 17, the black frame insertion circuit 12 includes black frame insertion transmission sub-circuits 123.

For example, the number of the black frame insertion transmission sub-circuits 123 is the same as the number of the shift registers 1 included in the shift register group 10, and a single black frame insertion transmission sub-circuit 123 is electrically connected to a pull-up node PU of a single shift register 1 in the shift register group 10.

Here, structures of the input circuit 11, the black frame insertion circuit 12 and the output circuit 13 vary, which may be set according to actual needs. The structures of the input circuit 11, the black frame insertion circuit 12 and the output circuit 13 will be schematically described below.

In some examples, as shown in FIG. 8, the input circuit 11 includes a first transistor M1.

For example, as shown in FIG. 8, a control electrode of the first transistor M1 is electrically connected to the scan input signal terminal Iput, a first electrode of the first transistor M1 is electrically connected to the scan input signal terminal Iput, and a second electrode of the first transistor M1 is electrically connected to the pull-up node PU.

For example, in a case where the scan input signal is at a high level, the first transistor M1 may be turned on under the control of the scan input signal, receive the scan input signal, and transmit the scan input signal to the pull-up node PU, so that the voltage of the pull-up node PU rises.

In some examples, as shown in FIG. 8, the black frame insertion control sub-circuit 121 includes a second transistor M2 and a first capacitor C1.

For example, as shown in FIG. 8, a control electrode of the second transistor M2 is electrically connected to the first clock signal terminal BCK1, a first electrode of the second transistor M2 is electrically connected to the black frame insertion input signal terminal BI, and a second electrode of the second transistor M2 is electrically connected to the first black frame insertion node M.

For example, in a case where the first clock signal is at a high level, the second transistor M2 may be turned on under the control of the first clock signal, and transmit the black frame insertion input signal received at the black frame insertion input signal terminal BI to the first black frame insertion node M to charge the first black frame insertion node M, so that the voltage of the first black frame insertion node M rises.

For example, as shown in FIG. 8, a first terminal of the first capacitor C1 is electrically connected to the first black frame insertion node M, a second terminal of the first capacitor C1 is electrically connected to the first voltage signal terminal VGL1.

For example, in a process when the second transistor M2 is turned on to charge the first black frame insertion node M, the first capacitor C1 is also charged. After the second transistor M2 is turned off, the first capacitor C1 may discharge electricity, so that the voltage of the first black frame insertion node M is maintained at a high level.

In some examples, as shown in FIG. 8, the black frame insertion input sub-circuit 122 includes a third transistor M3.

For example, as shown in FIG. 8, a control electrode of the third transistor M3 is electrically connected to the first black frame insertion node M, a first electrode of the third transistor M3 is electrically connected to the second clock signal terminal BCK2, and a second electrode of the third transistor M3 is electrically connected to the second black frame insertion node K.

For example, in a case where the second transistor M2 is turned on to charge the first black frame insertion node M so that the voltage of the first black frame insertion node M rises, the third transistor M3 may be turned on under the control of the voltage of the first black frame insertion node M, receive the second clock signal, and transmit the second clock signal to the second black frame insertion node K.

In some examples, as shown in FIG. 8, the black frame insertion transmission sub-circuit 123 includes a fourth transistor M4.

For example, as shown in FIG. 8, a control electrode of the fourth transistor T4 is electrically connected to the second clock signal terminal BCK2, a first electrode of the fourth transistor T4 is electrically connected to the second black frame insertion node K, and a second electrode of the fourth transistor T4 is electrically connected to the pull-up node PU.

For example, in a case where the second clock signal is at a high level, the fourth transistor M4 may be turned on under the control of the second clock signal, and transmit the second clock signal from the second black frame insertion node K to the pull-up node PU to charge the pull-up node PU, so that the voltage of the pull-up node PU rises.

In some examples, as shown in FIG. 8, the output circuit 13 includes a fifth transistor M5, a sixth transistor M6 and a second capacitor C2.

For example, as shown in FIG. 8, a control electrode of the fifth transistor M5 is electrically connected to the pull-up node PU, a first electrode of the fifth transistor M5 is electrically connected to the third clock signal terminal CLKD, and a second electrode of the fifth transistor M5 is electrically connected to the shift signal terminal CR.

For example, in a case where the voltage of the pull-up node PU is at a high level, the fifth transistor M5 may be turned on under the control of the voltage of the pull-up node PU, and output the third clock signal received at the third clock signal terminal CLKD from the shift signal terminal CR as the shift signal.

For example, as shown in FIG. 8, a control electrode of the sixth transistor M6 is electrically connected to the pull-up node PU, a first electrode of the sixth transistor M6 is electrically connected to the fourth clock signal terminal CLKE, and a second electrode of the sixth transistor M6 is electrically connected to the first output signal terminal Oput1.

For example, in a case where the voltage of the pull-up node PU is at a high level, the sixth transistor M6 may be turned on under the control of the voltage of the pull-up node PU, and output the fourth clock signal received at the fourth clock signal terminal CLKE from the first output signal terminal Oput1. The signal output by the first output signal terminal Oput1 have different functions in different time periods, reference can be made to the descriptions in the above examples, and details will not be repeated here.

For example, as shown in FIG. 8, a first electrode of the second capacitor C2 is electrically connected to the pull-up node PU, a second electrode of the second capacitor C2 is electrically connected to the first output signal terminal Oput1.

For example, in a process when the first transistor M1 is turned on to charge the pull-up node PU, the second capacitor C2 is also charged. After the first transistor M1 is turned off, the second capacitor C2 may discharge electricity, so that the voltage of the pull-up node PU is maintained at a high level.

For another example, in a process when the black frame insertion circuit 12 is turned on to charge the pull-up node PU, the second capacitor C2 is also charged. After the black frame insertion circuit 12 is turned off, the second capacitor C2 may discharge electricity, so that the voltage of the pull-up node PU is maintained at a high level.

In some examples, as shown in FIG. 10, in a case where the output circuit 13 is further electrically connected to the fifth clock signal terminal CLKF and the second output signal terminal Oput2, the output circuit 13 further includes a seventh transistor M7 and a third capacitor C3.

For example, as shown in FIG. 10, a control electrode of the seventh transistor M7 is electrically connected to the pull-up node PU, a first electrode of the seventh transistor M7 is electrically connected to the fifth clock signal terminal CLKF, and a second electrode of the seventh transistor M7 is electrically connected to the second output signal terminal Oput2.

For example, in a case where the pull-up node PU is at a high level, the seventh transistor M7 may be turned on under the control of the voltage of the pull-up node PU, and output the fifth clock signal received at the fifth clock signal terminal CLKF from the second output signal terminal Oput2. The signal output by the second output signal terminal Oput2 have different functions in different time periods, reference can be made to the descriptions in the above examples, and details will not be repeated here.

For example, as shown in FIG. 10, a first terminal of the third capacitor C3 is electrically connected to the pull-up node PU, and a second terminal of the third capacitor C3 is electrically connected to the second output signal terminal Oput2.

For example, in a process when the first transistor M1 is turned on to charge the pull-up node PU, the third capacitor C3 is also charged. After the first transistor M1 is turned off, the third capacitor C3 may discharge electricity, so that the voltage of the pull-up node PU is maintained at a high level.

For another example, in a process when the black frame insertion circuit 12 is turned on to charge the pull-up node PU, the third capacitor C3 is also charged. After the black frame insertion circuit 12 is turned off, the third capacitor C3 may discharge electricity, so that the voltage of the pull-up node PU is maintained at a high level.

In some embodiments, the shift register 1 may further include other circuit structures, which may be set according to actual needs.

Figure 11:
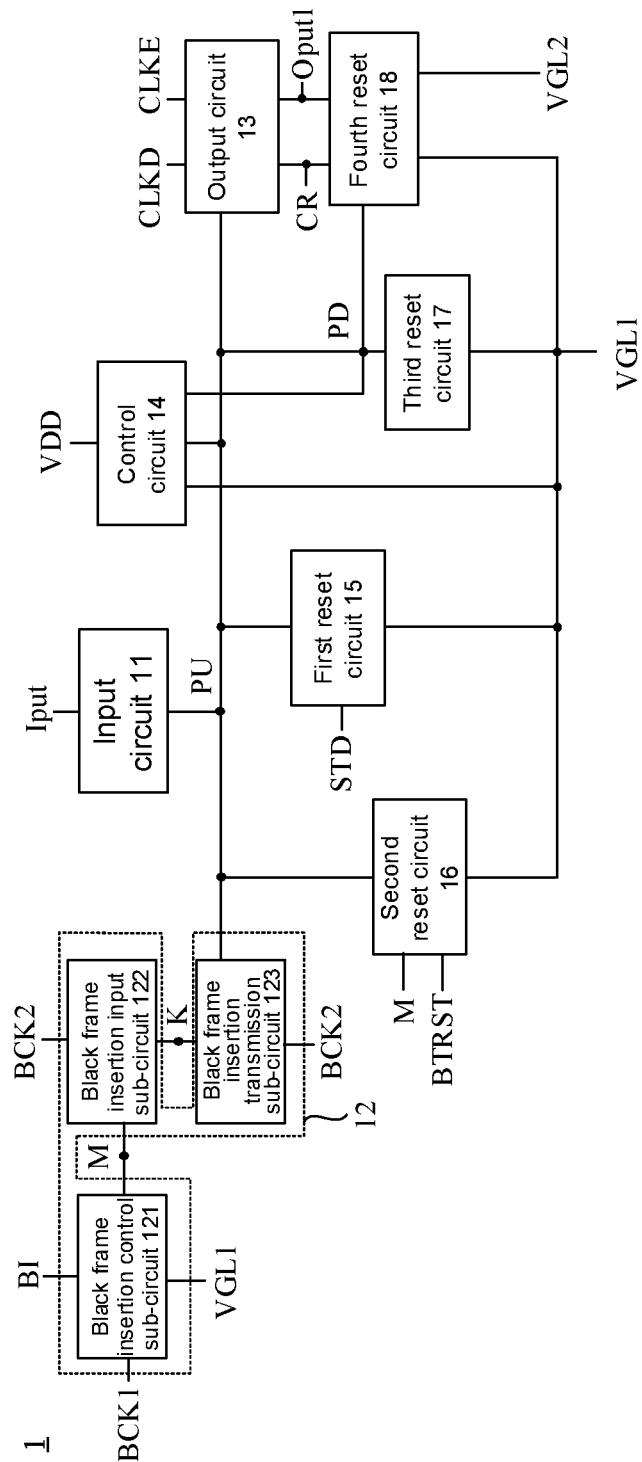
FIG. 11 is a circuit diagram of yet another shift register, in accordance with some embodiments of the present disclosure.
Figure 12:
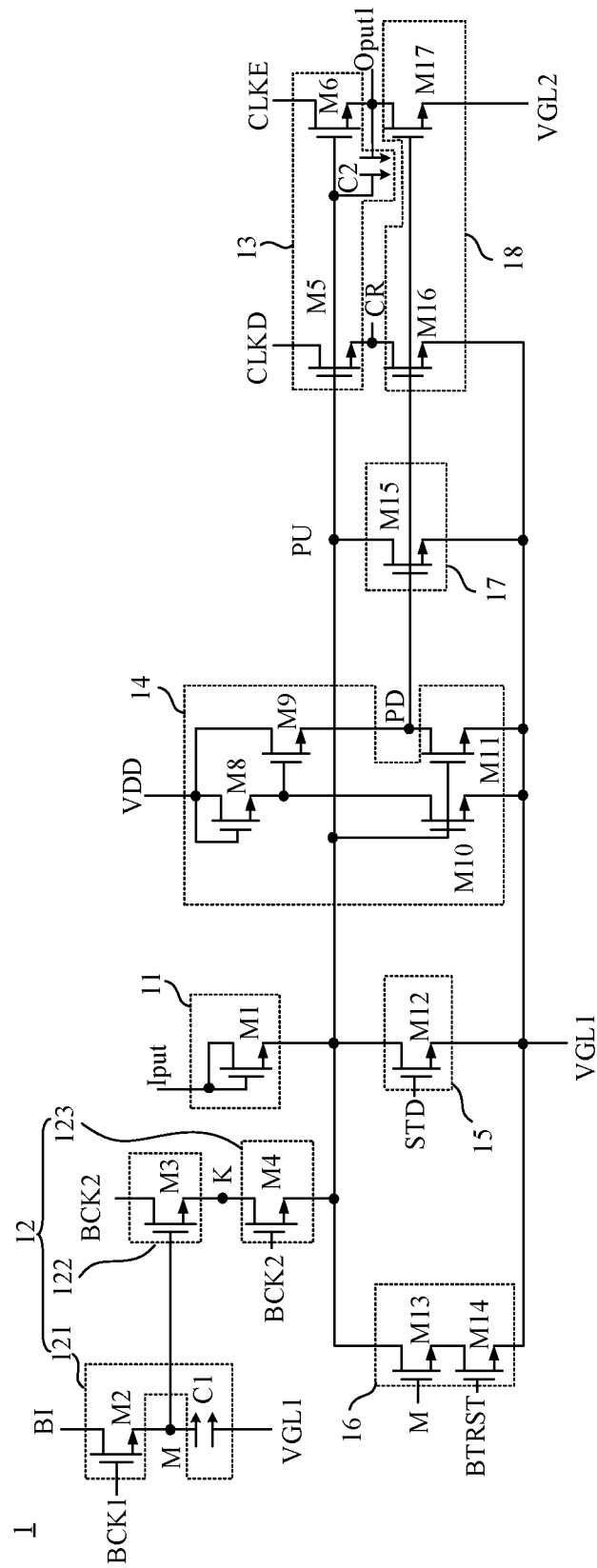
FIG. 12 is a circuit diagram of yet another shift register, in accordance with some embodiments of the present disclosure.

In some examples, as shown in FIGS. 11 and 12, the shift register circuit 1 may further include a control circuit 14 and a second voltage signal terminal VDD.

For example, as shown in FIGS. 11 and 12, the control circuit 14 is electrically connected to the second voltage signal terminal VDD, the pull-up node PU, the first voltage signal terminal VGL1 and the pull-down node PD. The control circuit 14 is configured to: in response to a second voltage signal received at the second voltage signal terminal VDD, transmit the second voltage signal to the pull-down node PD; and under the control of the voltage of the pull-up node PU, transmit the first voltage signal received at the first voltage signal terminal VGL1 to the pull-down node PD.

Here, the second voltage signal terminal VDD is configured to transmit a direct current high level signal (e.g., higher than or equal to a high-level portion of a clock signal). The terms "high level" and "low level" herein are relative. For example, a voltage value of the second voltage signal is greater than a voltage value of the first voltage signal.

For example, under the control of the second voltage signal, the control circuit 14 may receive the second voltage signal, and transmit the second voltage signal to the pull-down node PD. For example, in the case where the voltage of the pull-up node PU is at a high level, under the control of the voltage of the pull-up node PU, the control circuit 14 may receive the first voltage signal, and transmit the first voltage signal to the pull-down node PD, so as to pull down and reset the pull-down node PD.

In some examples, as shown in FIGS. 11 and 12, the shift register 1 may further include a first reset circuit 15 and a first reset signal terminal STD.

For example, as shown in FIGS. 11 and 12, the first reset circuit 15 is electrically connected to the first reset signal terminal STD, the pull-up node PU, and the first voltage signal terminal VGL1. The first reset circuit 15 is configured to transmit the first voltage signal to the pull-up node PU under control of a first reset signal transmitted by the first reset signal terminal STD.

For example, in a case where the first reset signal is at a high level, the first reset circuit 15 may be turned on under the control of the first reset signal, and transmit the first voltage signal received at the first voltage signal terminal VGL1 to the pull-up node PU, so as to pull down and reset the pull-up node PU.

It will be noted that, for the plurality of shift registers 1 that are connected in cascade to constitute the scan driving circuit 100, except for the first few shift registers 1 (e.g., the first shift register 1 to the fourth shift register 1, or the first shift register 1 to the fifth shift register 1), a first reset signal terminal STD of each remaining shift register 1 may be electrically connected to a shift signal terminal CR of a subsequent shift register 1, so that a shift signal output by the subsequent shift register 1 may be used as a first reset signal received by the remaining shift register 1.

Correspondingly, first reset signal terminals STD of part of the shift registers 1 may be electrically connected to display reset signal lines, so as to receive display reset signals transmitted by the display reset signal lines as first reset signals. The part of the shift registers 1 may be, for example, last four shift registers 1 or last five shift registers 1 in the scan driving circuit 100. In this way, cascaded reset may be realized.

In some examples, as shown in FIGS. 11 and 12, the shift register 1 may further include a second reset circuit 16 and a second reset signal terminal BTRST.

For example, as shown in FIGS. 11 and 12, the second reset circuit 16 is electrically connected to the first black frame insertion node M, the second reset signal terminal BTRST, the pull-up node PU and the first voltage signal terminal VGL1. The second reset circuit 16 is configured to transmit the first voltage signal to the pull-up node PU under control of the voltage of the first black frame insertion node M and a second reset signal transmitted by the second reset signal terminal BTRST.

For example, in a case where the voltage of the first black frame insertion node M is at a high level, and the second reset signal is at a high level, the second reset circuit 16 may be turned on under the control of the voltage of the first black frame insertion node M and the second reset signal, and transmit the first voltage signal received at the first voltage signal terminal VGL1 to the pull-up node PU, so as to pull down and reset the pull-up node PU.

The second reset circuit 16 may, for example, reset the pull-up node PU after the black frame insertion sub-period.

In some examples, as shown in FIGS. 11 and 12, the shift register 1 may further include a third reset circuit 17.

For example, as shown in FIGS. 11 and 12, the third reset circuit 17 is electrically connected to the pull-down node PD, the pull-up node PU and the first voltage signal terminal VGL1. The third reset circuit 17 is configured to transmit the first voltage signal to the pull-up node PU under the control of the voltage of the pull-down node PD.

For example, in a case where the voltage of the pull-down node PD is at a high level, the third reset circuit 17 may be turned on under the control of the voltage of the pull-down node PD, and transmit the first voltage signal received at the first voltage signal terminal VGL1 to the pull-up node PU, so as to pull down and reset the pull-up node PU.

In some examples, as shown in FIGS. 11 and 12, the shift register 1 may further include a fourth reset circuit 18 and a third voltage signal terminal VGL2.

For example, as shown in FIGS. 11 and 12, the fourth reset circuit 18 is electrically connected to the pull-down node PD, the shift signal terminal CR, the first output signal terminal Oput1, the first voltage signal terminal VGL1 and the third voltage signal terminal VGL2. The fourth reset circuit 18 is configured to, under the control of the voltage of the pull-down node PD, transmit the first voltage signal to the shift signal terminal CR and transmit a third voltage signal transmitted by the third voltage signal terminal VGL2 to the first output signal terminal Oput1.

For example, in a case where the voltage of the pull-down node PD is at a high level, the fourth reset circuit 18 may be turned on under the control of the voltage of the pull-down node PD, transmit the first voltage signal received at the first voltage signal terminal VGL1 to the shift signal terminal CR to pull down and reset the shift signal terminal CR, and transmit the third voltage signal received at the third voltage signal terminal VGL2 to the first output signal terminal Oput1 to pull down and reset the first output signal terminal Oput1.

Here, the third voltage signal terminal VGL2 is configured to transmit a direct current low level signal (e.g., lower than or equal to a low-level portion of a clock signal). For example, the third voltage signal terminal VGL2 is grounded. A voltage value of the second voltage signal is greater than a voltage value of the third voltage signal. The voltage value of the first voltage signal and the voltage value of the third voltage signal may be equal, or may be not equal.

Figure 13:
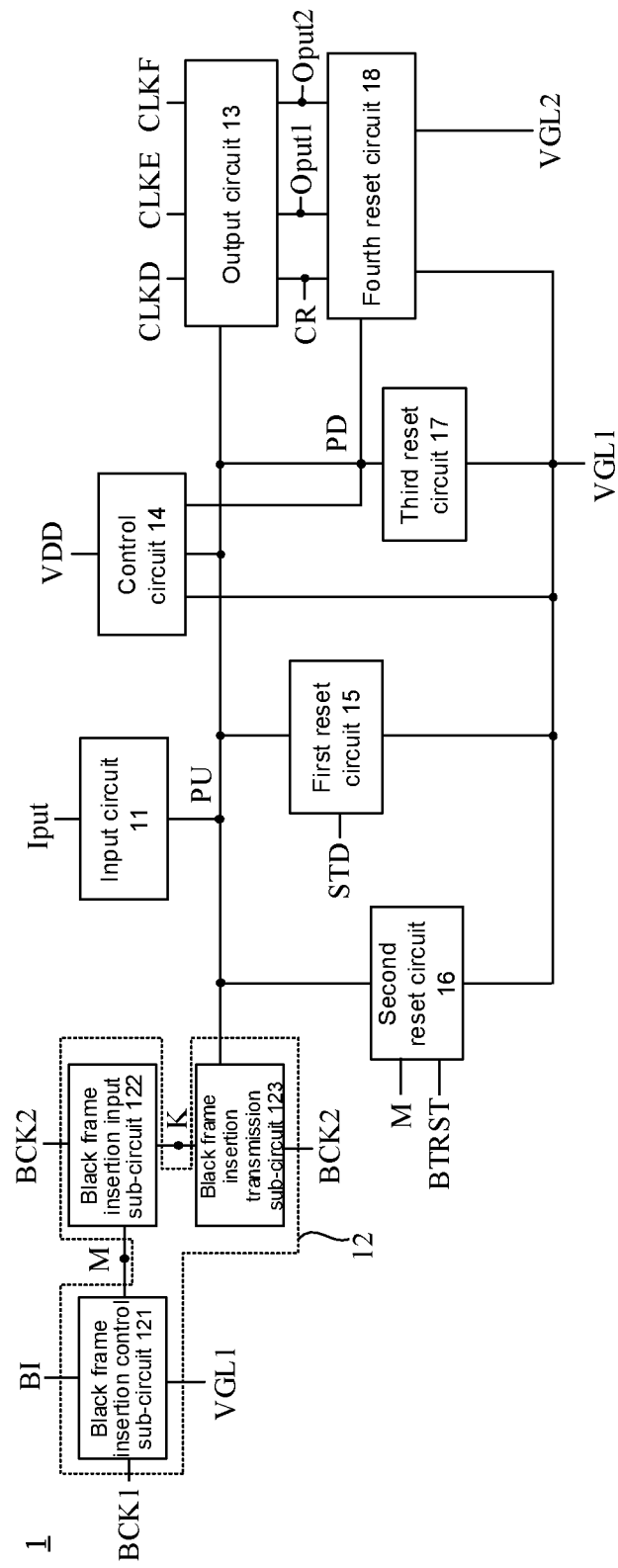
FIG. 13 is a circuit diagram of yet another shift register, in accordance with some embodiments of the present disclosure.
Figure 14:
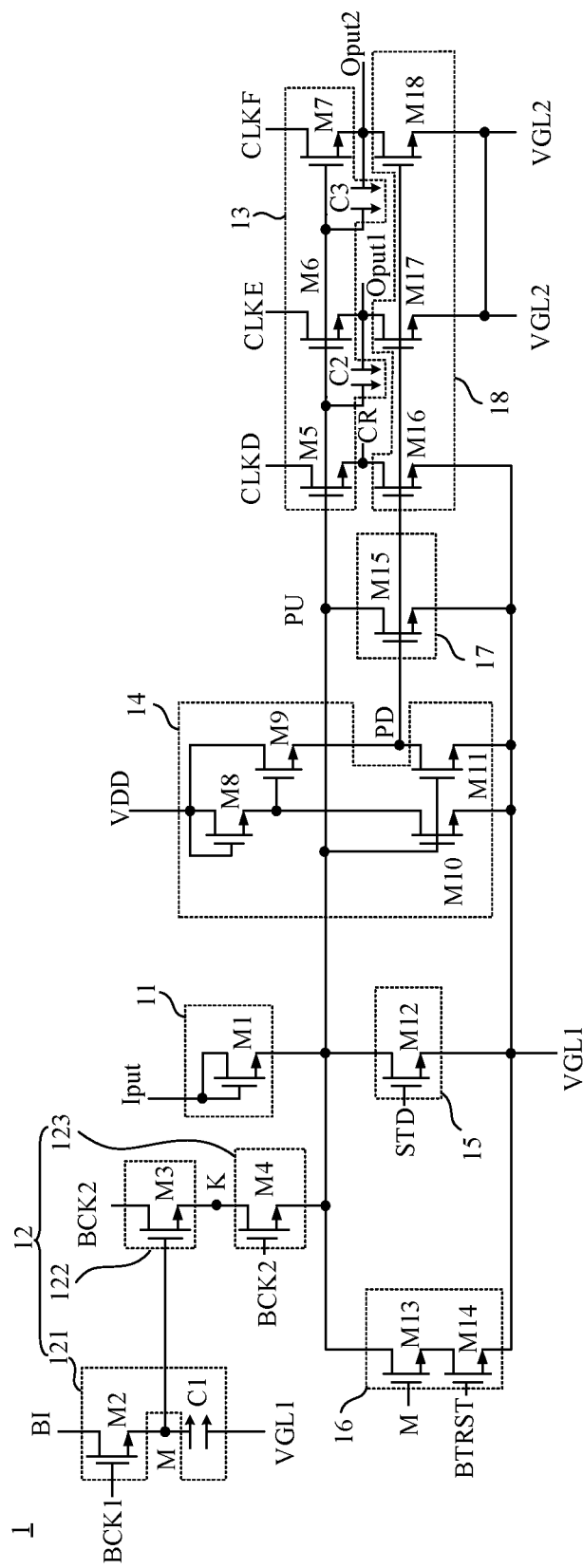
FIG. 14 is a circuit diagram of yet another shift register, in accordance with some embodiments of the present disclosure.

For example, as shown in FIGS. 13 and 14, in a case where the output circuit 13 is further electrically connected to the fifth clock signal terminal CLKF and the second output signal terminal Oput2, the fourth reset circuit 18 is further electrically connected to the second output signal terminal Oput2. The fourth reset circuit 18 is further configured to transmit the third voltage signal to the second output signal terminal Oput2 under the control of the voltage of the pull-down node PD.

For example, in a case where the voltage of the pull-down node PD is at a high level, the fourth reset circuit 18 may be turned on under the control of the voltage of pull-down node PU, and transmit the third voltage signal received at the third voltage signal terminal VGL2 to the second output signal terminal Oput2, so as to pull down and reset the second output signal terminal Oput2.

The structures of the control circuit 14, the first reset circuit 15, the second reset circuit 16, the third reset circuit 17 and the fourth reset circuit 18 vary, which may be set according to actual needs. The structures of the control circuit 14, the first reset circuit 15, the second reset circuit 16, the third reset circuit 17 and the fourth reset circuit 18 will be schematically described below.

In some examples, as shown in FIG. 12, the control circuit 14 includes an eighth transistor M8, a ninth transistor M9, a tenth transistor M10 and an eleventh transistor M11.

For example, as shown in FIG. 12, a control electrode of the eighth transistor M8 is electrically connected to the second voltage signal terminal VDD, a first electrode of the eighth transistor M8 is electrically connected to the second voltage signal terminal VDD, and a second electrode of the eighth transistor M8 is electrically connected to a control electrode of the ninth transistor M9 and a first electrode of the tenth transistor M10. A first electrode of the ninth transistor M9 is electrically connected to the second voltage signal terminal VDD, and a second electrode of the ninth transistor M9 is electrically connected to the pull-down node PD.

For example, the eighth transistor M8 may be turned on under the control of the second voltage signal, receive the second voltage signal, and transmit the second voltage signal to the control electrode of the ninth transistor M9. The ninth transistor M9 may be turned on under the control of the second voltage signal, receive the second voltage signal, and transmit the second voltage signal to the pull-down node PD to charge the pull-down node PD, so that the voltage of the pull-down node PD rises.

For example, as shown in FIG. 12, a control electrode of the tenth transistor M10 is electrically connected to the pull-up node PU, and a second electrode of the tenth transistor M10 is electrically connected to the first voltage signal terminal VGL1.

For example, in a case where the voltage of the pull-up node PU is at a high level, the tenth transistor M10 may be turned on under the control of the voltage of the pull-up node PU, receive the first voltage signal, and transmit the first voltage signal to the control electrode of the ninth transistor M9. The ninth transistor M9 may be turned off under the control of the first voltage signal.

For example, as shown in FIG. 12, a control electrode of the eleventh transistor M11 is electrically connected to the pull-up node PU, a first electrode of the eleventh transistor M11 is electrically connected to the pull-down node PD, and a second electrode of the eleventh transistor M11 is electrically connected to the first voltage signal terminal VGL1.

For example, in a case where the voltage of the pull-up node PU is at a high level, the eleventh transistor M11 may be turned on under the control of the voltage of the pull-up node PU, receive the first voltage signal, and transmit the first voltage signal to the pull-down node PD, so as to pull down and reset the pull-down node PD.

In some examples, as shown in FIG. 12, the first reset circuit 15 includes a twelfth transistor M12.

For example, as shown in FIG. 12, a control electrode of the twelfth transistor M12 is electrically connected to the first reset signal terminal STD, a first electrode of the twelfth transistor M12 is electrically connected to the pull-up node PU, and a second electrode of the twelfth transistor M12 is electrically connected to the first voltage signal terminal VGL1.

For example, in a case where the first reset signal is at a high level, the twelfth transistor M12 may be turned on under the control of the first reset signal, receive the first voltage signal, and transmit the first voltage signal to the pull-up node PU, so as to pull down and reset the pull-up node PU.

In some examples, as shown in FIG. 12, the second reset circuit 16 includes a thirteenth transistor M13 and a fourteenth transistor M14.

For example, as shown in FIG. 12, a control electrode of the thirteenth transistor M13 is electrically connected to the first black frame insertion node M, a first electrode of the thirteenth transistor M13 is electrically connected to the pull-up node PU, and a second electrode of the thirteenth transistor M13 is electrically connected to a first electrode of the fourteenth transistor M14. A control electrode of the fourteenth transistor M14 is electrically connected to the second reset signal terminal BTRST, and a second electrode of the fourteenth transistor M14 is electrically connected to the first voltage signal terminal VGL1.

For example, in a case where the voltage of the first black frame insertion node M is at a high level, and the second reset signal is at a high level, the thirteenth transistor M13 may be turned on under the control of the voltage of the first black frame insertion node M, the fourteenth transistor M14 may be turned on under the control of the second reset signal. The fourteenth transistor M14 may receive the first voltage signal and transmit the first voltage signal to the second electrode of the thirteenth transistor M13, and the thirteenth transistor M13 may transmit the first voltage signal to the pull-up node PU, so as to pull down and reset the pull-up node PU.

In some examples, as shown in FIG. 12, the third reset circuit 17 includes a fifteenth transistor M15.

For example, as shown in FIG. 12, a control electrode of the fifteenth transistor M15 is electrically connected to the pull-down node PD, a first electrode of the fifteenth transistor M15 is electrically connected to the pull-up node PU, and a second electrode of the fifteenth transistor M15 is electrically connected to the first voltage signal terminal VGL1.

For example, in the case where the voltage of the pull-down node PD is at a high level, the fifteenth transistor M15 may be turned on under the control of the voltage of the pull-up node PD, receive the first voltage signal, and transmit the first voltage signal to the pull-up node PU, so as to pull down and reset the pull-up node PU.

In some examples, as shown in FIG. 14, the fourth reset circuit 18 includes a sixteenth transistor M16, a seventeenth transistor M17 and an eighteenth transistor M18.

For example, as shown in FIG. 14, a control electrode of the sixteenth transistor M16 is electrically connected to the pull-down node PD, a first electrode of the sixteenth transistor M16 is electrically connected to the shift signal terminal CR, and a second electrode of the sixteenth transistor M16 is electrically connected to the first voltage signal terminal VGL1.

For example, in a case where the voltage of the pull-down node PD is at a high level, the sixteenth transistor M16 may be turned on under the control of the voltage of the pull-down node PD, receive the first voltage signal, and transmit the first voltage signal to the shift signal terminal CR, so as to pull down and reset the shift signal terminal CR.

For example, as shown in FIG. 14, a control electrode of the seventeenth transistor M17 is electrically connected to the pull-down node PD, a first electrode of the seventeenth transistor M17 is electrically connected to the first output signal terminal Oput1, and a second electrode of the seventeenth transistor M17 is electrically connected to the third voltage signal terminal VGL2.

For example, in a case where the voltage of the pull-down node PD is at a high level, the seventeenth transistor M17 may be turned on under the control of the voltage of the pull-down node PD, receive the third voltage signal, and transmit the third voltage signal to the first output signal terminal Oput1, so as to pull down and reset the first output signal terminal Oput1.

For example, as shown in FIG. 14, a control electrode of the eighteenth transistor M18 is electrically connected to the pull-down node PD, a first electrode of the eighteenth transistor M18 is electrically connected to the second output signal terminal Oput2, and a second electrode of the eighteenth transistor M18 is electrically connected to the third voltage signal terminal VGL2.

For example, in a case where the voltage of the pull-down node PD is at a high level, the eighteenth transistor M18 may be turned on under the control of the voltage of the pull-down node PD, receive the third voltage signal, and transmit the third voltage signal to the second output signal terminal Oput2, so as to pull down and reset the second output signal terminal Oput2.

Hereinafter, the operation process of the scan driving circuit 100 will be schematically described by taking the structure of the scan driving circuit 100 shown in FIGS. 15, 18, 19A and 19B as an example. Here, i=1.

For example, as shown in FIG. 19A, A<1-8>, A<9-16>, A<17-24>, A<25-32>, . . . , A<1081-1088>, and A<1089-1096> represent different shift register groups 10, and each shift register group 10 includes eight shift registers 1. As shown in FIG. 16, two adjacent shift registers 1 share one black frame insertion circuit 12. In this case, the shift register group 10 may include four black frame insertion circuits 12.

For example, as shown in FIG. 18, each shift register group 10 includes eight shift registers 1, and the eight shift registers 1 include seven first shift registers 1a and one second shift register 1b.

For example, as shown in FIG. 19B, the plurality of clock signal lines 2 included in the scan driving circuit 100 may include: a first clock signal sub-line CLK_1 electrically connected to a third clock signal terminal CLKD and a fourth clock signal terminal CLKE of a first first shift register 1a in the M-th shift register group; a second clock signal sub-line CLK_2 electrically connected to a third clock signal terminal CLKD and a fourth clock signal terminal CLKE of a second first shift register 1a in the M-th shift register group; a third clock signal sub-line CLK_3 electrically connected to a third clock signal terminal CLKD and a fourth clock signal terminal CLKE of a third first shift register 1a in the M-th shift register group; a fourth clock signal sub-line CLK_4 electrically connected to a third clock signal terminal CLKD and a fourth clock signal terminal CLKE of a fourth first shift register 1a in the M-th shift register group; a fifth clock signal sub-line CLK_5 electrically connected to a third clock signal terminal CLKD and a fourth clock signal terminal CLKE of a fifth first shift register 1a in the M-th shift register group; a sixth clock signal sub-line CLK_6 electrically connected to a third clock signal terminal CLKD and a fourth clock signal terminal CLKE of a sixth first shift register 1a in the M-th shift register group; a seventh clock signal sub-line CLK_7 electrically connected to a third clock signal terminal CLKD and a fourth clock signal terminal CLKE of a seventh first shift register 1a in the M-th shift register group; an eighth clock signal sub-line CLK_8 electrically connected to a third clock signal terminal CLKD of a second shift register 1b in the M-th shift register group; a ninth clock signal sub-line CLK_9 electrically connected to a fourth clock signal terminal CLKE of the second shift register 1b in the M-th shift register group; a tenth clock signal sub-line CLK_10 electrically connected to a third clock signal terminal CLKD and a fourth clock signal terminal CLKE of a first first shift register 1a in the (M+1)-th shift register group; an eleventh clock signal sub-line CLK_11 electrically connected to a third clock signal terminal CLKD and a fourth clock signal terminal CLKE of a second first shift register 1a in the (M+1)-th shift register group; a twelfth clock signal sub-line CLK_12 electrically connected to a third clock signal terminal CLKD and a fourth clock signal terminal CLKE of a third first shift register 1a in the (M+1)-th shift register group; a thirteenth clock signal sub-line CLK_13 electrically connected to a third clock signal terminal CLKD and a fourth clock signal terminal CLKE of a fourth first shift register 1a in the (M+1)-th shift register group; a fourteenth clock signal sub-line CLK_14 electrically connected to a third clock signal terminal CLKD and a fourth clock signal terminal CLKE of a fifth first shift register 1a in the (M+1)-th shift register group; a fifteenth clock signal sub-line CLK_15 electrically connected to a third clock signal terminal CLKD and a fourth clock signal terminal CLKE of a sixth first shift register 1a in the (M+1)-th shift register group; a sixteenth clock signal sub-line CLK_16 electrically connected to a third clock signal terminal CLKD and a fourth clock signal terminal CLKE of a seventh first shift register 1a in the (M+1)-th shift register group; a seventeenth clock signal sub-line CLK_17 electrically connected to a third clock signal terminal CLKD of a second shift register 1b in the (M+1)-th shift register group; and an eighteenth clock signal sub-line CLK_18 electrically connected to a fourth clock signal terminal CLKE of the second shift register 1b in the (M+1)-th shift register group.

For example, as shown in FIG. 19A, the plurality of clock signal lines 2 included in the scan driving circuit 100 may further include: a nineteenth clock signal sub-line CLK_19, a twentieth clock signal sub-line CLK_20, a twenty-first clock signal sub-line CLK_21, and a twenty-second clock signal sub-line CLK_22.

For example, in a (2M−1)-th shift register group 10, first clock signal terminals BCK1 of all shift registers 1 are electrically connected to the nineteenth clock signal sub-line CLK_19. In the (2M−1)-th shift register group 10, second clock signal terminals BCK2 of all shift registers 1 are electrically connected to the twentieth clock signal sub-line CLK_20.

In a 2M-th shift register group 10, first clock signal terminals BCK1 of all shift registers 1 are electrically connected to the twenty-first clock signal sub-line CLK_21. In the 2M-th shift register group 10, second clock signal terminals BCK2 of all shift registers 1 are electrically connected to the twenty-second clock signal sub-line CLK_22.

In some embodiments, as shown in FIG. 19A, the plurality of clock signal lines 2 included in the scan driving circuit 100 further include a twenty-third clock signal sub-line CLK_23.

For example, a second reset signal terminal BTRST of each shift register 1 in each shift register group 10 is electrically connected to the twenty-third clock signal sub-line CLK_23.

It will be noted that, the cascaded relationship of the scan driving circuit 100 shown in FIGS. 19A and 19B is merely an example, and other cascaded relationship may also be used in the present disclosure according to actual needs.

Hereinafter, in combination with FIGS. 15, 19A, 19B and 20, a driving method of the scan driving circuit 100 as shown in FIGS. 16 and 18 in the display phase of one frame will be schematically described.

In a first phase 1, a first initial signal transmitted by the first initial signal line STV1 and a first clock signal transmitted by the nineteenth clock signal sub-line CLK_19 are each at a high level.

A second transistor M2 in each shift register 1 (i.e., each of a first shift register 1 to an eighth shift register 1) in a first shift register group 10 may be turned on under control of the first clock signal, receive the first initial signal, and transmit the first initial signal to a first black frame insertion node M to charge the first black frame insertion node M, so that a voltage of the first black frame insertion node M is at a high level.

In a second phase 2, a second reset signal transmitted by the twenty-third clock signal sub-line CLK_23 is at a high level.

A second reset circuit 16 in each shift register 1 in the first shift register group 10 is turned on. That is, a fourteenth transistor M14 is turned on under control of the second reset signal, and a thirteenth transistor M13 is turned on under the control of voltage of the first black frame insertion node M. The second reset circuit 16 receives a first voltage signal, and transmits the first voltage signal to a pull-up node PU, so as to pull down and reset the pull-up node PU.

In a third phase 3, an input circuit 11 in each shift register 1 (i.e., each of a 1081st shift register 1 to a 1088th shift register 1) in a 136th shift register group 10 receives a scan input signal, and transmits the input signal to a corresponding pull-up node PU, so that a voltage of the corresponding pull-up node PU is at a high level. An output circuit 13 of each shift register 1 in the 136th shift register group 10 is turned on under control of the voltage of the corresponding pull-up node PU, and outputs a first output signal. Rows of sub-pixels P (i.e., a 1081st row of sub-pixels P to a 1088th row of sub-pixels P) corresponding to the 136th shift register group 10 may perform image display in sequence.

In a fourth phase 4, a second clock signal transmitted by the twentieth clock signal sub-line CLK_20 is at a high level. Fourth clock signals transmitted by the first clock signal sub-line CLK_1 to the seventh clock signal sub-line CLK_7 and the ninth clock signal sub-line CLK_9 are each at a high level.

A black frame insertion input sub-circuit 122 and a black frame insertion transmission sub-circuit 123 in each black frame insertion circuit 12 in the first shift register group 10 are turned on. For example, a third transistor M3 is turned on under the control of the voltage of the first black frame insertion node M, receives the second clock signal, and transmits the second clock signal to a second black frame insertion node K. A fourth transistor M4 is turned on under control of the second clock signal, and transmits the second clock signal from the second black frame insertion node K to the pull-up node PU. In this case, the pull-up node PU of each shift register 1 in the first shift register group 10 may be charged, so that the voltage of the pull-up node PU is at a high level. Thus, the output circuit 13 of each shift register 1 is turned on.

Since the fourth clock signals transmitted by the first clock signal sub-line CLK_1 to the seventh clock signal sub-line CLK_7 and the ninth clock signal sub-line CLK_9 are each at a high level, the first output signals output by the output circuits 13 in the shift registers 1 in the first shift register group 10 are each at a high level.

After rows of sub-pixels P (i.e., a first row of sub-pixels P to an eighth row of sub-pixels P) corresponding to the first shift register group 10 receive the first output signals, the rows of sub-pixels P may stop emitting light, so that the display panel 1000 that adopts the scan driving circuit 100 displays a black image.

In addition, in this phase, a first clock signal transmitted by the twenty-first clock signal sub-line CLK_21 is at a high level. Second transistors M2 of shift registers 1 (i.e., a ninth shift register 1 to a sixteenth shift register 1) in a second shift register group 10 may be turned on under control of the first clock signal. A shift signal output by a second shift register 1b in the first shift register group 10 may be used as a black frame insertion input signal of the shift registers 1 in the second shift register group 10, and is transmitted to a first black insertion node M of each shift register 1 in the second shift register group 10, so that the first black insertion node M of each shift register 1 in the second shift register group 10 is maintained at a high level until a next black frame insertion sub-period.

In a fifth phase 5, the second reset signal transmitted by the twenty-third clock signal sub-line CLK_23 is at a high level.

The second reset circuit 16 in each shift register 1 in the first shift register group 10 is turned on. For example, the fourteenth transistor M14 is turned on under the control of the second reset signal, and the thirteenth transistor M13 is turned on under the control of the voltage of the first black frame insertion node M. The second reset circuit 16 receives the first voltage signal, and transmits the first voltage signal to the pull-up node PU, so as to pull down and reset the pull-up node PU.

Since the voltage of the first black frame insertion node M of each shift register 1 in the 136th shift register group 10 is at a low level, the voltage of the pull-up nodes PU of each shift register 1 in the 136th shift register group 10 is maintained at a high level.

In a sixth phase 6, the first clock signal transmitted by the nineteenth clock signal sub-line CLK_19 is at a high level, and the first initial signal transmitted by the first initial signal line STV1 is at a low level.

The second transistor M2 in each shift register 1 in the first shift register group 10 may be turned on under the control of the first clock signal, receive the first initial signal, and transmit the first initial signal to the first black frame insertion node M to discharge the first black frame insertion node M, so that the voltage of the first black frame insertion node M is at a low level.

In a seventh phase 7, the rows of sub-pixels P corresponding to the shift registers 10 in the first shift register group 10 perform image display.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A scan driving circuit, comprising a plurality of shift registers and a plurality of clock signal lines; wherein
    each shift register of the plurality of shift registers includes:
        an input circuit,
        a black frame insertion circuit,
        an output circuit,
        a scan input signal terminal,
        a first clock signal terminal,
        a black frame insertion input signal terminal,
        a first voltage signal terminal,
        a second clock signal terminal,
        a third clock signal terminal,
        a shift signal terminal,
        a fourth clock signal terminal, and
        a first output signal terminal;
    the input circuit is electrically connected to the scan input signal terminal and a pull-up node;
    the input circuit is configured to:
        in response to a scan input signal received at the scan input signal terminal, transmit the scan input signal to the pull-up node;
    the black frame insertion circuit is electrically connected to the first clock signal terminal, the black frame insertion input signal terminal, the first voltage signal terminal, the second clock signal terminal and the pull-up node;
    the black frame insertion circuit is configured to, under control of a first clock signal transmitted by the first clock signal terminal, a black frame insertion input signal transmitted by the black frame insertion input signal terminal and a second clock signal transmitted by the second clock signal terminal, transmit the second clock signal to the pull-up node;
    the output circuit is electrically connected to the pull-up node, the third clock signal terminal, the shift signal terminal, the fourth clock signal terminal and the first output signal terminal;
    the output circuit is configured to:
        transmit a third clock signal received at the third clock signal terminal to the shift signal terminal under control of a voltage of the pull-up node, and
        transmit a fourth clock signal received at the fourth clock signal terminal to the first output signal terminal under the control of the voltage of the pull-up node;
    wherein the plurality of shift registers include first shift registers and second shift registers;
    a third clock signal terminal and a fourth clock signal terminal of each first shift register of the first shift registers are electrically connected to a same clock signal line; and a third clock signal terminal and a fourth clock signal terminal of each second shift register of the second shift registers are electrically connected to different clock signal lines, respectively.

2. The scan driving circuit according to claim 1, wherein at least one first shift register of the first shift registers is arranged between any two adjacent second shift registers of the second shift registers.

3. The scan driving circuit according to claim 1, wherein the plurality of shift registers include a plurality of shift register groups; each shift register group of the plurality of shift register groups includes at least one of the first shift registers and at least one of the second shift registers; and a shift signal terminal of a second shift register in an M-th shift register group is electrically connected to a black frame insertion input signal terminal of at least one shift register in an (M+1)-th shift register group, M being a positive integer.

4. The scan driving circuit according to claim 3, wherein the shift register group includes two or more first shift registers and one second shift register; and the shift signal terminal of the second shift register in the M-th shift register group is electrically connected to black frame insertion input signal terminals of all shift registers in the (M+1)-th shift register group.

5. The scan driving circuit according to claim 3, wherein a third clock signal terminal of the second shift register in the M-th shift register group and a third clock signal terminal of a second shift register in the (M+1)-th shift register group are electrically connected to different clock signal lines.

6. The scan driving circuit according to claim 5, wherein the third clock signal terminal of the second shift register in the M-th shift register group and a third clock signal terminal of a second shift register in an (M+2)-th shift register group are electrically connected to a same clock signal line.

7. The scan driving circuit according to claim 3, wherein the shift register group includes two or more second shift registers; and third clock signal terminals of two or more second shift registers in a same shift register group are electrically connected to different clock signal lines, respectively.

8. The scan driving circuit according to claim 3, wherein a number of clock signal lines electrically connected to fourth clock signal terminals of the plurality of shift registers is a sum of a number of shift registers included in the M-th shift register group and a number of shift registers included in the (M+1)-th shift register group; and a number of clock signal lines electrically connected to third clock signal terminals of the second shift registers is a sum of a number of second shift registers included in the M-th shift register group and a number of second shift registers included in the (M+1)-th shift register group.

9. The scan driving circuit according to claim 3, wherein the shift register group includes seven first shift registers and one second shift register;

the plurality of clock signal lines include:

a first clock signal sub-line electrically connected to a third clock signal terminal and a fourth clock signal terminal of a first first shift register in the M-th shift register group;

a second clock signal sub-line electrically connected to a third clock signal terminal and a fourth clock signal terminal of a second first shift register in the M-th shift register group;

a third clock signal sub-line electrically connected to a third clock signal terminal and a fourth clock signal terminal of a third first shift register in the M-th shift register group;

a fourth clock signal sub-line electrically connected to a third clock signal terminal and a fourth clock signal terminal of a fourth first shift register in the M-th shift register group;

a fifth clock signal sub-line electrically connected to a third clock signal terminal and a fourth clock signal terminal of a fifth first shift register in the M-th shift register group;

a sixth clock signal sub-line electrically connected to a third clock signal terminal and a fourth clock signal terminal of a sixth first shift register in the M-th shift register group;

a seventh clock signal sub-line electrically connected to a third clock signal terminal and a fourth clock signal terminal of a seventh first shift register in the M-th shift register group;

an eighth clock signal sub-line electrically connected to a third clock signal terminal of the second shift register in the M-th shift register group;

a ninth clock signal sub-line electrically connected to a fourth clock signal terminal of the second shift register in the M-th shift register group;

a tenth clock signal sub-line electrically connected to a third clock signal terminal and a fourth clock signal terminal of a first first shift register in the (M+1)-th shift register group;

an eleventh clock signal sub-line electrically connected to a third clock signal terminal and a fourth clock signal terminal of a second first shift register in the (M+1)-th shift register group;

a twelfth clock signal sub-line electrically connected to a third clock signal terminal and a fourth clock signal terminal of a third first shift register in the (M+1)-th shift register group;

a thirteenth clock signal sub-line electrically connected to a third clock signal terminal and a fourth clock signal terminal of a fourth first shift register in the (M+1)-th shift register group;

a fourteenth clock signal sub-line electrically connected to a third clock signal terminal and a fourth clock signal terminal of a fifth first shift register in the (M+1)-th shift register group;

a fifteenth clock signal sub-line electrically connected to a third clock signal terminal and a fourth clock signal terminal of a sixth first shift register in the (M+1)-th shift register group;

a sixteenth clock signal sub-line electrically connected to a third clock signal terminal and a fourth clock signal terminal of a seventh first shift register in the (M+1)-th shift register group;

a seventeenth clock signal sub-line electrically connected to a third clock signal terminal of a second shift register in the (M+1)-th shift register group; and an eighteenth clock signal sub-line electrically connected to a fourth clock signal terminal of the second shift register in the (M+1)-th shift register group.

10. The scan driving circuit according to claim 3, wherein at least two shift registers of shift registers included in the shift register group share one black frame insertion circuit.

11. The scan driving circuit according to claim 1, wherein the shift register further includes a fifth clock signal terminal and a second output signal terminal;

the output circuit is further electrically connected to the fifth clock signal terminal and the second output signal terminal; the output circuit is further configured to transmit a fifth clock signal received at the fifth clock signal terminal to the second output signal terminal under the control of the voltage of the pull-up node.

12. The scan driving circuit according to claim 1, wherein the black frame insertion circuit includes a black frame insertion control sub-circuit, a black frame insertion input sub-circuit and a black frame insertion transmission sub-circuit;
the black frame insertion control sub-circuit is electrically connected to the first clock signal terminal, the black frame insertion input signal terminal, the first voltage signal terminal and a first black frame insertion node; the black frame insertion control sub-circuit is configured to transmit the black frame insertion input signal transmitted by the black frame insertion input signal terminal to the first black frame insertion node under control of the first clock signal;
the black frame insertion input sub-circuit is electrically connected to the first black frame insertion node, the second clock signal terminal and a second black frame insertion node; the black frame insertion input sub-circuit is configured to transmit the second clock signal transmitted by the second clock signal terminal to the second black frame insertion node under control of a voltage of the first black frame insertion node;
the black frame insertion transmission sub-circuit is electrically connected to the second clock signal terminal, the second black frame insertion node and the pull-up node; the black frame insertion transmission sub-circuit is configured to transmit the second clock signal from the second black frame insertion node to the pull-up node under control of the second clock signal.

13. The scan driving circuit according to claim 1, wherein the input circuit includes a first transistor;
a control electrode of the first transistor is electrically connected to the scan input signal terminal, a first electrode of the first transistor is electrically connected to the scan input signal terminal, and a second electrode of the first transistor is electrically connected to the pull-up node;
the black frame insertion circuit includes a black frame insertion control sub-circuit, a black frame insertion input sub-circuit and a black frame insertion transmission sub-circuit;
the black frame insertion control sub-circuit includes a second transistor and a first capacitor;
a control electrode of the second transistor is electrically connected to the first clock signal terminal, a first electrode of the second transistor is electrically connected to the black frame insertion input signal terminal, and a second electrode of the second transistor is electrically connected to a first black frame insertion node;
a first terminal of the first capacitor is electrically connected to the first black frame insertion node, and a second terminal of the first capacitor is electrically connected to the first voltage signal terminal;
the black frame insertion input sub-circuit includes a third transistor;
a control electrode of the third transistor is electrically connected to the first black frame insertion node, a first electrode of the third transistor is electrically connected to the second clock signal terminal, and a second electrode of the third transistor is electrically connected to a second black frame insertion node;
the black frame insertion transmission sub-circuit includes a fourth transistor;
a control electrode of the fourth transistor is electrically connected to the second clock signal terminal, a first electrode of the fourth transistor is electrically connected to the second black frame insertion node, and a second electrode of the fourth transistor is electrically connected to the pull-up node;
the output circuit includes a fifth transistor, a sixth transistor and a second capacitor;
a control electrode of the fifth transistor is electrically connected to the pull-up node, a first electrode of the fifth transistor is electrically connected to the third clock signal terminal, and a second electrode of the fifth transistor is electrically connected to the shift signal terminal;
a control electrode of the sixth transistor is electrically connected to the pull-up node, a first electrode of the sixth transistor is electrically connected to the fourth clock signal terminal, and a second electrode of the sixth transistor is electrically connected to the first output signal terminal; and
a first terminal of the second capacitor is electrically connected to the pull-up node, and a second terminal of the second capacitor is electrically connected to the first output signal terminal.

14. The scan driving circuit according to claim 13, wherein the output circuit is further electrically connected to a fifth clock signal terminal and a second output signal terminal;
the output circuit further includes a seventh transistor and a third capacitor;
a control electrode of the seventh transistor is electrically connected to the pull-up node, a first electrode of the seventh transistor is electrically connected to the fifth clock signal terminal, and a second electrode of the seventh transistor is electrically connected to the second output signal terminal; and
a first terminal of the third capacitor is electrically connected to the pull-up node, and a second terminal of the third capacitor is electrically connected to the second output signal terminal.

15. The scan driving circuit according to claim 12, wherein the shift register further includes: a control circuit, a first reset circuit, a second reset circuit, a third reset circuit, a fourth reset circuit, a second voltage signal terminal, a third voltage signal terminal, a first reset signal terminal and a second reset signal terminal;
the control circuit is electrically connected to the second voltage signal terminal, the pull-up node, the first voltage signal terminal and a pull-down node; the control circuit is configured to: in response to a second voltage signal received at the second voltage signal terminal, transmit the second voltage signal to the pull-down node; and under the control of the voltage of the pull-up node, transmit a first voltage signal received at the first voltage signal terminal to the pull-down node;
the first reset circuit is electrically connected to the first reset signal terminal, the pull-up node and the first voltage signal terminal; the first reset circuit is configured to transmit the first voltage signal to the pull-up node under control of a first reset signal transmitted by the first reset signal terminal;

the second reset circuit is electrically connected to the first black frame insertion node, the second reset signal terminal, the pull-up node and the first voltage signal terminal; the second reset circuit is configured to transmit the first voltage signal to the pull-up node under control of the voltage of the first black frame insertion node and a second reset signal transmitted by the second reset signal terminal;

the third reset circuit is electrically connected to the pull-down node, the pull-up node and the first voltage signal terminal; the third reset circuit is configured to transmit the first voltage signal to the pull-up node under control of a voltage of the pull-down node;

the fourth reset circuit is electrically connected to the pull-down node, the shift signal terminal, the first output signal terminal, the first voltage signal terminal and the third voltage signal terminal; the fourth reset circuit is configured to, under the control of the voltage of the pull-down node, transmit the first voltage signal to the shift signal terminal and transmit a third voltage signal transmitted by the third voltage signal terminal to the first output signal terminal;

the output circuit is further electrically connected to a fifth clock signal terminal and a second output signal terminal;

the fourth reset circuit is further electrically connected to the second output signal terminal; the fourth reset circuit is further configured to transmit the third voltage signal to the second output signal terminal under the control of the voltage of the pull-down node.

16. The scan driving circuit according to claim 15, wherein the control circuit includes an eighth transistor, a ninth transistor, a tenth transistor and an eleventh transistor, wherein a control electrode of the eighth transistor is electrically connected to the second voltage signal terminal, a first electrode of the eighth transistor is electrically connected to the second voltage signal terminal, and a second electrode of the eighth transistor is electrically connected to a control electrode of the ninth transistor and a first electrode of the tenth transistor;

a first electrode of the ninth transistor is electrically connected to the second voltage signal terminal, and a second electrode of the ninth transistor is electrically connected to the pull-down node;

a control electrode of the tenth transistor is electrically connected to the pull-up node, and a second electrode of the tenth transistor is electrically connected to the first voltage signal terminal; and a control electrode of the eleventh transistor is electrically connected to the pull-up node, a first electrode of the eleventh transistor is electrically connected to the pull-down node, and a second electrode of the eleventh transistor is electrically connected to the first voltage signal terminal;

the first reset circuit includes a twelfth transistor, wherein a control electrode of the twelfth transistor is electrically connected to the first reset signal terminal, a first electrode of the twelfth transistor is electrically connected to the pull-up node, and a second electrode of the twelfth transistor is electrically connected to the first voltage signal terminal;

the second reset circuit includes a thirteenth transistor and a fourteenth transistor, wherein a control electrode of the thirteenth transistor is electrically connected to the first black frame insertion node, a first electrode of the thirteenth transistor is electrically connected to the pull-up node, and a second electrode of the thirteenth transistor is electrically connected to a first electrode of the fourteenth transistor; and a control electrode of the fourteenth transistor is electrically connected to the second reset signal terminal, and a second electrode of the fourteenth transistor is electrically connected to the first voltage signal terminal;

the third reset circuit includes a fifteenth transistor, wherein a control electrode of the fifteenth transistor is electrically connected to the pull-down node, a first electrode of the fifteenth transistor is electrically connected to the pull-up node, and a second electrode of the fifteenth transistor is electrically connected to the first voltage signal terminal;

the fourth reset circuit includes a sixteenth transistor, a seventeenth transistor and an eighteenth transistor, wherein a control electrode of the sixteenth transistor is electrically connected to the pull-down node, a first electrode of the sixteenth transistor is electrically connected to the shift signal terminal, and a second electrode of the sixteenth transistor is electrically connected to the first voltage signal terminal;

a control electrode of the seventeenth transistor is electrically connected to the pull-down node, a first electrode of the seventeenth transistor is electrically connected to the first output signal terminal, and a second electrode of the seventeenth transistor is electrically connected to the third voltage signal terminal; and a control electrode of the eighteenth transistor is electrically connected to the pull-down node, a first electrode of the eighteenth transistor is electrically connected to the second output signal terminal, and a second electrode of the eighteenth transistor is electrically connected to the third voltage signal terminal.

17. A display panel, comprising the scan driving circuit according to claim 1.

18. A display apparatus, comprising the display panel according to claim 17.

* * * * *